US012670854B2

(12) United States Patent
Wang et al.

(10) Patent No.: US 12,670,854 B2
(45) Date of Patent: Jun. 30, 2026

(54) DISPLAY PANEL AND DISPLAY APPARATUS

(71) Applicants: Chongqing BOE Display Technology Co., Ltd., Chongqing (CN); BOE Technology Group Co., Ltd., Beijing (CN)

(72) Inventors: Rui Wang, Beijing (CN); Ming Hu, Beijing (CN); Haijun Qiu, Beijing (CN); Juntao Chen, Beijing (CN)

(73) Assignees: CHONGQING BOE DISPLAY TECHNOLOGY CO., LTD., Chongqing (CN); BOE TECHNOLOGY GROUP CO., LTD., Beijing (CN)

(*) Notice: Subject to any disclaimer, the term of this patent is extended or adjusted under 35 U.S.C. 154(b) by 47 days.

(21) Appl. No.: 18/579,507

(22) PCT Filed: Apr. 27, 2022

(86) PCT No.: PCT/CN2022/089636
§ 371 (c)(1),
(2) Date: Jan. 16, 2024

(87) PCT Pub. No.: WO2023/206157
PCT Pub. Date: Nov. 2, 2023

(65) Prior Publication Data
US 2024/0331631 A1     Oct. 3, 2024

(51) Int. Cl.
*G09G 3/3233*     (2016.01)
*H10K 59/121*     (2023.01)
*H10K 59/131*     (2023.01)

(52) U.S. Cl.
CPC ....... *G09G 3/3233* (2013.01); *H10K 59/1213* (2023.02); *H10K 59/1216* (2023.02);
(Continued)

(58) Field of Classification Search
CPC ............. G09G 3/3233; G09G 2310/08; G09G 2320/0233; H10K 59/1213;
(Continued)

(56) References Cited

U.S. PATENT DOCUMENTS

| | | | |
|---|---|---|---|
| 11,961,471 B2* | 4/2024 | Du | G09G 3/3241 |
| 2004/0056355 A1* | 3/2004 | Minami | H01L 24/05 |
| | | | 257/E23.153 |

(Continued)

FOREIGN PATENT DOCUMENTS

| | | |
|---|---|---|
| CN | 107195665 A | 9/2017 |
| CN | 112331681 A | 2/2021 |

(Continued)

OTHER PUBLICATIONS

International Search Report and Written Opinion mailed on Jan. 9, 2023, in corresponding PCT/CN2022/089636, 6 pages.
(Continued)

*Primary Examiner* — William Lu
(74) *Attorney, Agent, or Firm* — XSENSUS LLP

(57) ABSTRACT

The present disclosure provides a display panel and a display device. The display panel includes: a base substrate, a first active layer on a side of the base substrate, and a third conductive layer on a side of the first active layer away from the base substrate. The first active layer includes active portions spaced apart, wherein each active portion includes a sub-active portion and a via-hole connection portion connected to each other, and the sub-active portion is disposed corresponding to a transistor of two or more transistors, and configured to form a channel region of the corresponding transistor. The third conductive layer includes at least one bridge portion, wherein the at least one bridge portion is connected to via-hole connection portions in different active portions through via holes, respectively. A (Continued)

sheet resistance of the third conductive layer is less than a sheet resistance of the via hole connection portion.

18 Claims, 25 Drawing Sheets

(52) U.S. Cl.
CPC ..... *H10K 59/1315* (2023.02); *G09G 2310/08* (2013.01); *G09G 2320/0233* (2013.01)

(58) Field of Classification Search
CPC ........... H10K 59/1216; H10K 59/1315; H10K 59/131; H10D 86/00
See application file for complete search history.

(56) References Cited

U.S. PATENT DOCUMENTS

| | | | | |
|---|---|---|---|---|
| 2006/0091468 A1* | 5/2006 | Liaw | ..................... | H10B 10/12 |
| | | | | 257/E21.59 |
| 2007/0072420 A1* | 3/2007 | Shin | .................... | H01L 21/7681 |
| | | | | 438/687 |
| 2007/0152342 A1* | 7/2007 | Tsao | .................. | H01L 21/76846 |
| | | | | 257/E23.145 |
| 2009/0152735 A1* | 6/2009 | Lee | ................... | H01L 21/28562 |
| | | | | 257/774 |
| 2014/0251667 A1* | 9/2014 | Granstrom | ............. | H05K 1/115 |
| | | | | 174/262 |
| 2017/0053975 A1* | 2/2017 | Cho | ....................... | H10D 86/60 |

| | | | | |
|---|---|---|---|---|
| 2017/0177125 A1* | 6/2017 | Kim | ................... | G02F 1/136286 |
| 2018/0019297 A1* | 1/2018 | Dirnecker | ............. | H01L 21/268 |
| 2021/0183313 A1* | 6/2021 | Dong | ................. | H10K 59/1213 |
| 2021/0210474 A1* | 7/2021 | Ikeda | ......................... | G09F 9/33 |
| 2021/0320166 A1* | 10/2021 | Zhao | .................... | H10D 86/441 |
| 2022/0020827 A1* | 1/2022 | Liu | ................... | H10K 59/80516 |
| 2022/0181419 A1* | 6/2022 | Qian | .................. | H10K 59/1213 |
| 2022/0254855 A1* | 8/2022 | Zhang | ................. | H10K 59/122 |
| 2023/0157107 A1* | 5/2023 | Lee | ...................... | H10K 59/131 |
| | | | | 257/72 |
| 2024/0038156 A1* | 2/2024 | Zhang | ................. | H10K 59/123 |
| 2024/0038164 A1* | 2/2024 | Shang | ................. | H10D 86/421 |
| 2024/0161696 A1* | 5/2024 | Zhang | ................. | G09G 3/3233 |
| 2024/0177659 A1* | 5/2024 | Liu | ......................... | H10K 59/35 |
| 2024/0224637 A1* | 7/2024 | Wang | .................. | G09G 3/3233 |
| 2024/0331631 A1* | 10/2024 | Wang | ................. | H10K 59/1213 |
| 2024/0389414 A1* | 11/2024 | Yang | .................... | H10D 86/441 |
| 2025/0294987 A1* | 9/2025 | Shi | ......................... | G09G 3/3233 |

FOREIGN PATENT DOCUMENTS

| | | | | |
|---|---|---|---|---|
| CN | 114122101 A | 3/2022 | | |
| CN | 114220821 A | 3/2022 | | |
| CN | 114373773 A | 4/2022 | | |
| KR | 2015-0075733 A | 7/2015 | | |
| WO | WO-2022257081 A1 * | 12/2022 | ........... | G09G 3/3233 |

OTHER PUBLICATIONS

International Search Report and Written Opinion mailed on Jan. 6, 2023, in corresponding PCT/CN2022/108756, 6 pages.

* cited by examiner

DISPLAY PANEL AND DISPLAY APPARATUS

CROSS-REFERENCE TO RELATED APPLICATIONS

The present application is the U.S. National phase application of International Application No. PCT/CN2022/089636, filed on Apr. 27, 2022, the entire contents of which are hereby incorporated by reference in its entirety.

TECHNICAL FIELD

The present disclosure relates to the field of display technologies, and in particular, to a display panel and a display device.

BACKGROUND

In the related art, the transistors in the display panel are connected to each other by conductive traces in the active layer. However, the sheet resistance of the conductive trace in the active layer is large, and the fluctuation of the film thickness and size of the conductive trace may have a large impact on the overall resistance of the current path in the display panel, which ultimately leads to the display panel's low gray-scale mura problem (i.e., uneven display brightness) and sandy mura problem (i.e., uneven brightness brought by the graininess).

It should be noted that the above information disclosed in the "BACKGROUND" section is intended only to enhance understanding of the context of the present disclosure, and thus may include information that does not constitute prior art known to those of ordinary skill in the art.

SUMMARY

According to one aspect of the present disclosure, there is provided a display panel. The display panel includes two or more transistors, and further includes: a base substrate, a first active layer, and a third conductive layer. The first active layer is located on a side of the base substrate, the first active layer including a plurality of active portions spaced apart, wherein each active portion of the plurality of active portions includes a sub-active portion and a via-hole connection portion connected to each other, and the sub-active portion is disposed corresponding to a transistor of the two or more transistors, and configured to form a channel region of the corresponding transistor. The third conductive layer is located on a side, away from the base substrate, of the first active layer, the third conductive layer including at least one bridge portion, wherein the at least one bridge portion is connected to via-hole connection portions in different active portions through via holes, respectively, A sheet resistance of the third conductive layer is less than a sheet resistance of the via hole connection portion.

In some embodiments of the present disclosure, the display panel further includes a pixel driving circuit, wherein the pixel driving circuit includes a plurality of transistors, and the sub-active portion is configured to form a channel region of a transistor of the plurality of transistors in the pixel driving circuit.

In some embodiments of the present disclosure, the pixel driving circuit includes: a driver transistor, a first transistor, and a second transistor: wherein a first electrode of the first transistor is connected to a first initial signal line, and a second electrode of the first transistor is connected to a gate of the driver transistor; and a first electrode of the second transistor is connected to the gate of the driver transistor, and a second electrode of the second transistor is connected to a first electrode of the driver transistor. The plurality of active portions include: a first active portion and a second active portion. The first active portion includes a first sub-active portion and a first via-hole connection portion connected to each other, wherein the first sub-active portion is configured to form a channel region of the first transistor, and the first via-hole connection portion is configured to form the via-hole connection portion. The second active portion includes a second sub-active portion and a second via-hole connection portion connected to each other, wherein the second sub-active portion is configured to form a channel region of the second transistor, and the second via-hole connection portion is configured to form the via-hole connection portion. The at least one bridge portion includes a first bridge portion being connected to the first via-hole connection portion and the second via-hole connection portion through via holes, respectively.

In some embodiments of the present disclosure, the pixel driving circuit includes: a driver transistor and a fourth transistor; wherein a first electrode of the fourth transistor is connected to a data line and a second electrode of the fourth transistor is connected to a second electrode of the driver transistor. The plurality of active portions include a third active portion and a fourth active portion. The third active portion includes a third sub-active portion and a third via-hole connection portion connected to each other, wherein the third sub-active portion is configured to form a channel region of the driver transistor, and the third via-hole connection portion is configured to form the via-hole connection portion. The fourth active portion includes a fourth sub-active portion and a fourth via-hole connection portion connected to each other, wherein the fourth sub-active portion is configured to form a channel region of the fourth transistor, and the fourth via-hole connection portion is configured to form the via-hole connection portion. The at least one bridge portion includes a second bridge portion being connected to the third via-hole connection portion and the fourth connection portion through via holes, respectively.

In some embodiments of the present disclosure, the pixel driving circuit includes: a driver transistor and a fifth transistor: wherein a first electrode of the fifth transistor is connected to a power line and a second electrode of the fifth transistor is connected to a second electrode of the driver transistor. The plurality of active portions include a third active portion and a fifth active portion. The third active portion includes a third sub-active portion and a third via-hole connection portion connected to each other. The third sub-active portion is configured to form a channel region of the driver transistor, and the third via-hole connection portion is configured to form the via-hole connection portion. The fifth active portion includes a fifth sub-active portion and a fifth via-hole connection portion connected to each other, wherein the fifth sub-active portion is configured to form a channel region of the fifth transistor, and the fifth via-hole connection portion is configured to form the via-hole connection portion. The at least one bridge portion includes a third bridge portion being connected to the third via-hole connection portion and the fifth connection portion through via holes, respectively.

In some embodiments of the present disclosure, the pixel driving circuit is configured to drive a light emitting unit to emit light, and the pixel driving circuit includes: a driver transistor and a sixth transistor; wherein a first electrode of the sixth transistor is connected to a first electrode of the driver transistor, and a second electrode of the sixth transistor is connected to a first electrode of the light emitting unit. The plurality of active portions include: a third active portion and a sixth active portion. The third active portion includes a third sub-active portion and an eighth via-hole connection portion connected to each other, wherein the third sub-active portion is configured to form a channel region of the driver transistor, and the eighth via-hole connection portion is configured to form the via-hole connection portion. The sixth active portion includes a sixth sub-active portion and a sixth via-hole connection portion connected to each other, wherein the sixth sub-active portion is configured to form a channel region of the sixth transistor, and the sixth via-hole connection portion is configured to form the via-hole connection portion. The at least one bridge portion includes a fourth bridge portion being connected to the eighth via-hole connection portion and the sixth connection portion through via holes, respectively.

In some embodiments of the present disclosure, the pixel driving circuit is configured to drive a light emitting unit to emit light, and the pixel driving circuit includes: a driver transistor, a sixth transistor, and a seventh transistor; wherein a first electrode of the sixth transistor is connected to a first electrode of the driver transistor, and a second electrode of the sixth transistor is connected to a first electrode of the light emitting unit; and a first electrode of the seventh transistor is connected to a second initial signal line, and a second electrode of the seventh transistor is connected to the first electrode of the light emitting unit. The plurality of active portions include a sixth active portion and a seventh active portion. The sixth active portion includes a sixth sub-active portion and a ninth via-hole connection portion connected to each other, wherein the sixth sub-active portion is configured to form a channel region of the sixth transistor, and the ninth via-hole connection portion is configured to form the via-hole connection portion. The seventh active portion includes a seventh sub-active portion and a seventh via-hole connection portion connected to each other, wherein the seventh sub-active portion is configured to form a channel region of the seventh transistor, and the seventh via-hole connection portion is configured to form the via-hole connection portion. The at least one bridge portion includes: a fifth bridge portion being connected to the ninth via-hole connection portion and the seventh connection portion through via holes, respectively.

In some embodiments of the present disclosure, the pixel driving circuit includes: a driver transistor and a second transistor; wherein a first electrode of the second transistor is connected to a gate of the driver transistor and a second electrode of the second transistor is connected to a first electrode of the driver transistor. The plurality of active portions include: a third active portion and a second active portion. The third active portion includes a third sub-active portion and an eighth via-hole connection portion connected to each other, wherein the third sub-active portion is configured to form a channel region of the driver transistor, and the eighth via-hole connection portion is configured to form the via-hole connection portion. The second active portion includes a second sub-active portion and a tenth via-hole connection portion connected to each other, wherein the second sub-active portion is configured to form a channel region of the second transistor, and the tenth via-hole connection portion is configured to form the via-hole connection portion. The at least one bridge portion includes a sixth bridge portion being connected to the tenth via-hole connection portion and the eighth connection portion through via holes, respectively.

In some embodiments of the present disclosure, the pixel driving circuit includes: a driver transistor, a first transistor, and a second transistor: wherein a first electrode of the first transistor is connected to a first initial signal line, and a second electrode of the first transistor is connected to a gate of the driver transistor; and a first electrode of the second transistor is connected to the gate of the driver transistor, and a second electrode of the second transistor is connected to a first electrode of the driver transistor. The plurality of active portions include a first active portion and a third active portion. The first active portion includes a first sub-active portion and a first via-hole connection portion connected to each other, wherein the first sub-active portion is configured to form a channel region of the first transistor, and the first via-hole connection portion is configured to form the via-hole connection portion. The third active portion includes a second sub-active portion, a third sub-active portion, and a second via-hole connection portion connected to a side of the second sub-active portion away from the third sub-active portion. The display panel further includes a first conductive layer between the first active layer and the third conductive layer, the first conductive layer including: a first reset signal line, a first gate line, and a first conductive portion. An orthographic projection of the first reset signal line on the base substrate extends in a first direction and covers an orthographic projection of the first sub-active portion on the base substrate, and a portion of the first reset signal line is configured to form a gate of the first transistor. An orthographic projection of the first gate line on the base substrate extends in the first direction and covers an orthographic projection of the second sub-active portion on the base substrate, and a portion of the first gate line is configured to form a gate of the second transistor. An orthographic projection of the first conductive portion on the base substrate covers an orthographic projection of the third sub-active portion on the base substrate, and the first conductive portion is configured to form the gate of the driver transistor. The orthographic projection of the first reset signal line on the base substrate is on a side, away from the orthographic projection of the first conductive portion on the base substrate, of the orthographic projection of the first gate line on the base substrate. The at least one bridge portion includes a first bridge portion being connected to the first via-hole connection portion and the second via-hole connection portion through via holes, respectively, wherein an orthographic projection of the first bridge portion on the base substrate extends in the first direction, and is between the orthographic projection of the first reset signal line on the base substrate and the orthographic projection of the first gate line on the base substrate.

In some embodiments of the present disclosure, the pixel driving circuit further includes a second transistor: wherein a first electrode of the second transistor is connected to a gate of the driver transistor, a second electrode of the second transistor is connected to a first electrode of the driver transistor, and a gate of the second transistor is connected to a first gate line. The display panel further includes a first conductive layer between the first active layer and the third conductive layer, the first conductive layer including a first conductive portion, the first gate line, and a second gate line. An orthographic projection of the first conductive portion on the base substrate covers an orthographic projection of the third sub-active portion on the base substrate, and the first conductive portion is configured to form the gate of the driver transistor. An orthographic projection of the first gate line on the base substrate extends in a first direction. An orthographic projection of the second gate line on the base substrate extends in the first direction, and covers an orthographic projection of the fourth sub-active portion on the base substrate, and a portion of the second gate line is configured to form a gate of the fourth transistor. The orthographic projection of the second gate line on the base substrate is on a side, away from the orthographic projection of the first gate line on the base substrate, of the orthographic projection of the first conductive portion on the base substrate. An orthographic projection of the second bridge portion on the base substrate extends in the first direction, and is between the orthographic projection of the first conductive portion on the base substrate and the orthographic projection of the second gate line on the base substrate.

In some embodiments of the present disclosure, the pixel driving circuit includes a fifth transistor: wherein a first electrode of the fifth transistor is connected to a power line and a second electrode of the fifth transistor is connected to the second electrode of the driver transistor. The plurality of active portions further include: a fifth active portion including a fifth sub-active portion and a fifth via-hole connection portion connected to each other, wherein the fifth sub-active portion is configured to form a channel region of the fifth transistor, and the fifth via-hole connection portion is configured to form the via-hole connection portion. The first conductive layer further includes a first enabling signal line, wherein an orthographic projection of the first enabling signal line on the base substrate extends in the first direction, and covers an orthographic projection of the fifth sub-active portion on the base substrate, and a portion of the first enabling signal line is configured to form a gate of the fifth transistor. The orthographic projection of the first enabling signal line on the base substrate is on a side, away from the orthographic projection of the first conductive portion on the base substrate, of the orthographic projection of the second gate line on the base substrate. The at least one bridge portion includes a third bridge portion being connected to the third via-hole connection portion and the fifth via-hole connection portion through via holes, respectively, wherein the third bridge portion and the second bridge portion share a portion of a conductive portion and use the shared portion of the conductive portion to connect to the third via-hole connection portion through a same via hole. An orthographic projection of the third bridge portion on the base substrate extends in a second direction, the second direction intersects the first direction, and the orthographic projection of the third bridge portion on the base substrate is between the orthographic projection of the first conductive portion on the base substrate and the orthographic projection of the first enabling signal line on the base substrate.

In some embodiments of the present disclosure, the pixel driving circuit further includes a second transistor and a fifth transistor; wherein a first electrode of the second transistor is connected to a gate of the driver transistor, and a second electrode of the second transistor is connected to the first electrode of the driver transistor, and a gate of the second transistor is connected to a first gate line; and a first electrode of the fifth transistor is connected to a power line, a second electrode of the fifth transistor is connected to a second electrode of the driver transistor, and a gate of the fifth transistor being connected to a first enabling signal line. The display panel further includes a first conductive layer between the first active layer and the third conductive layer, the first conductive layer including: the first enabling signal line, the first gate line, a second enabling signal line, and a first conductive portion. An orthographic projection of the first enabling signal line on the base substrate extends in a first direction. An orthographic projection of the first gate line on the base substrate extends in the first direction. An orthographic projection of the first conductive portion on the base substrate covers an orthographic projection of the third sub-active portion on the base substrate, and the first conductive portion is configured to form the gate of the driver transistor. An orthographic projection of the second enabling signal line on the base substrate extends in the first direction, and covers an orthographic projection of the sixth sub-active portion on the base substrate, and a portion of the second enabling signal line is configured to form a gate of the sixth transistor. The orthographic projection of the second enabling signal line on the base substrate is on a side, away from the orthographic projection of the first conductive portion on the base substrate, of the orthographic projection of the first enabling signal line on the base substrate. An orthographic projection of the fourth bridge portion on the base substrate extends in a second direction, the second direction intersects the first direction, and the orthographic projection of the fourth bridge portion on the base substrate is between the orthographic projection of the first gate line on the base substrate and the orthographic projection of the second enabling signal line on the base substrate.

In some embodiments of the present disclosure, a gate of the sixth transistor is connected to a second enabling signal line. The display panel further includes a first conductive layer between the first active layer and the third conductive layer, the first conductive layer including: the second enabling signal line, a first conductive portion, and a second reset signal line. An orthographic projection of the second enabling signal line on the base substrate extends in the first direction. An orthographic projection of the first conductive portion on the base substrate covers an orthographic projection of the third sub-active portion on the base substrate, and the first conductive portion is configured to form a gate of the driver transistor. An orthographic projection of the second reset signal line on the base substrate extends in the first direction, and covers an orthographic projection of the seventh sub-active portion on the base substrate, and a portion of the second reset signal line is configured to form a gate of the seventh transistor. The orthographic projection of the second reset signal line on the base substrate is on a side, away from the orthographic projection of the first conductive portion on the base substrate, of the orthographic projection of the second enabling signal line on the base substrate. An orthographic projection of the fifth bridge portion on the base substrate extends in the first direction, and the orthographic projection of the fifth bridge portion on the base substrate is between the orthographic projection of the second reset line on the base substrate and the orthographic projection of the second enabling signal line on the base substrate.

In some embodiments of the present disclosure, the pixel driving circuit is configured to drive a light emitting unit to emit light, and the pixel driving circuit includes: a driver transistor, a first transistor, and a seventh transistor. A first electrode of the first transistor is connected to a first initial signal line, and a second electrode of the first transistor is connected to a gate of the driver transistor; and a first electrode of the seventh transistor is connected to a second initial signal line, and a second electrode of the seventh transistor is connected to a first electrode of the light emitting unit. The display panel further includes: a first conductive layer and a second conductive layer. The first conductive layer is between the first active layer and the third conductive layer. The second conductive layer is between the first conductive layer and the third conductive layer, the second conductive layer including the first initial signal line and the second initial signal line, wherein an orthographic projection of the first initial signal line on the base substrate and an orthographic projection of the second initial signal line on the base substrate extend in a second direction.

In some embodiments of the present disclosure, the pixel driving circuit further includes a capacitor; wherein a first electrode of the capacitor is connected to a power line, and a second electrode of the capacitor is connected to the gate of the driver transistor. The plurality of active portions include a first active portion and a seventh active portion. At least part of the first active portion is configured to form a channel region of the first transistor. At least part of the seventh active portion is configured to form a channel region of the seventh transistor. An orthographic projection of the power line on the base substrate extends in the second direction, and the orthographic projection of the power line on the base substrate is between an orthographic projection of the first active portion on the base substrate and an orthographic projection of the seventh active portion on the base substrate. The orthographic projection of the first initial signal line on the base substrate is on a side, away from the orthographic projection of the power line on the base substrate, of the orthographic projection of the first active portion on the base substrate. The orthographic projection of the second initial signal line on the base substrate is on a side, away from the orthographic projection of the power line on the base substrate, of the orthographic projection of the seventh active portion on the base substrate.

In some embodiments of the present disclosure, the pixel driving circuit is configured to drive a light emitting unit to emit light, and the pixel driving circuit includes: a driver transistor, a first transistor, a second transistor, a fourth transistor, a fifth transistor, a sixth transistor, and a seventh transistor. A first electrode of the first transistor is connected to a first initial signal line, and a second electrode of the first transistor is connected to a gate of the driver transistor; a first electrode of the second transistor is connected to the gate of the driver transistor, and a second electrode of the second transistor is connected to a first electrode of the driver transistor; a first electrode of the fourth transistor is connected to a data line, and a second electrode of the fourth transistor is connected to a second electrode of the driver transistor: a first electrode of the fifth transistor is connected to a power line, and a second electrode of the fifth transistor is connected to the second electrode of the driver transistor; a first electrode of the sixth transistor is connected to the first electrode of the driver transistor, and a second electrode of the sixth transistor is connected to a first electrode of the light emitting unit; and a first electrode of the seventh transistor is connected to a second initial signal line, and a second electrode of the seventh transistor is connected to the first electrode of the light emitting unit. The driver transistor, the first transistor, the second transistor, the fourth transistor, the fifth transistor, the sixth transistor, and the seventh transistor are P-type transistors.

In some embodiments of the present disclosure, the pixel driving circuit includes: a driver transistor, a first transistor, and a second transistor; wherein a first electrode of the first transistor is connected to a first initial signal line, and a second electrode of the first transistor is connected to a first electrode of the driver transistor; a first electrode of the second transistor is connected to a gate of the driver transistor, and a second electrode of the second transistor is connected to the first electrode of the driver transistor, the driver transistor and the first transistor being a P-type transistor, the second transistor being a N-type transistor. The plurality of active portions include: a first active portion and a third active portion. The first active portion includes a first sub-active portion and a first via-hole connection portion connected to each other, wherein the first sub-active portion is configured to form a channel region of the first transistor, and the first via-hole connection portion is configured to form the via-hole connection portion. The third active portion includes a third sub-active portion and an eighth via-hole connection portion connected to each other, wherein the third sub-active portion is configured to form a channel region of the driver transistor, and the eighth via-hole connection portion is configured to form the via-hole connection portion. The display panel further includes a second active layer between the first active layer and the third conductive layer, the second active layer including a second active portion, the second active portion including a second sub-active portion and a second via-hole connection portion connected to each other, the second sub-active portion being configured to form a channel region of the second transistor. The at least one bridge portion includes: a first bridge portion being connected to the first via-hole connection portion, the eighth via-hole connection portion, and the second via-hole connection portion through via holes, respectively.

In some embodiments of the present disclosure, the display panel further includes a first conductive layer and a fourth conductive layer. The first conductive layer is between the first active layer and the second active layer, the first conductive layer including: a first reset signal line and a first conductive portion. An orthographic projection of the first reset signal line on the base substrate extends in a first direction and covers an orthographic projection of the first sub-active portion on the base substrate, and a portion of the first reset signal line is configured to form a gate of the first transistor. An orthographic projection of the first conductive portion on the base substrate covers an orthographic projection of the third sub-active portion on the base substrate, and the first conductive portion is configured to form the gate of the driver transistor. The fourth conductive layer is between the second active layer and the third conductive layer, the fourth conductive layer including: a first gate line, wherein an orthographic projection of the first gate line on the base substrate extends in the first direction, and is between the orthographic projection of the first reset signal line on the base substrate and the orthographic projection of the first conductive portion on the base substrate, the orthographic projection of the first gate line on the base substrate covers an orthographic projection of the second sub-active portion on the base substrate, a portion of the first gate line is configured to form a top gate of the second transistor. An orthographic projection of the first bridge portion on the base substrate extends in a second direction, the orthographic projection of the first bridge portion on the base substrate is on a side, facing the orthographic projection of the first conductive portion on the base substrate, of the orthographic projection of the first reset signal line on the base substrate, and the orthographic projection of the first bridge portion on the base substrate intersects the orthographic projection of the first gate line on the base substrate.

In some embodiments of the present disclosure, a gate of the second transistor is connected to a first gate line, the pixel driving circuit is configured to drive a light emitting unit to emit light, and the pixel driving circuit further includes a sixth transistor; wherein a first electrode of the sixth transistor is connected to the first electrode of the driver transistor, and a second electrode of the sixth transistor is connected to a first electrode of the light emitting unit. The plurality of active portions further include: a sixth active portion including a sixth sub-active portion, and a sixth via-hole connection being connected to the sixth sub-active portion, the sixth sub-active portion being configured to form a channel region of the sixth transistor. The display panel further includes: a first conductive layer between the first active layer and the second active layer, the first conductive layer including: an enabling signal line, wherein an orthographic projection of the enabling signal line on the base substrate extends in the first direction and covers an orthographic projection of the sixth sub-active portion on the base substrate, and a portion of the enabling signal line is configured to form a gate of the sixth transistor; and the orthographic projection of the enabling signal line on the base substrate is on a side, away from an orthographic projection of the first gate line on the base substrate, of an orthographic projection of a first conductive portion on the base substrate. The at least one bridge portion includes: a fourth bridge portion being connected to the eighth via-hole connection portion and the sixth connection portion through via holes, respectively; wherein the fourth bridge portion and the first bridge portion share a portion of a conductive portion, and use the shared portion of the conductive portion to connect to the eighth via-hole connection portion through a same via hole. An orthographic projection of the fourth bridge portion on the base substrate extends in the second direction, and is between the orthographic projection of the enabling signal line on the base substrate and the orthographic projection of the first gate line on the base substrate.

In some embodiments of the present disclosure, the pixel driving circuit further includes a fourth transistor and a fifth transistor; wherein a first electrode of the fourth transistor is connected to a data line, and a second electrode of the fourth transistor is connected to a second electrode of the driver transistor; a first electrode of the fifth transistor is connected to a power line, a second electrode of the fifth transistor is connected to the second electrode of the driver transistor, and a gate of the fifth transistor is connected to an enabling signal line. The third active part further includes: a fourth sub-active portion and a fourth via-hole connection portion. The fourth sub-active portion is connected to a side of the third sub-active portion away from the eighth via-hole connection portion, the fourth sub-active portion being configured to form a channel region of the fourth transistor. The fourth via-hole connection portion is connected between the fourth sub-active portion and the third sub-active portion, the fourth via-hole connection portion being configured to form the via-hole connection portion. The display panel further includes: a first conductive layer between the first active layer and the second active layer, the first conductive layer including: a second gate line, wherein an orthographic projection of the second gate line on the base substrate extends in the first direction and covers an orthographic projection of the fourth sub-active portion on the base substrate, and a portion of the second gate line is configured to form a gate of the fourth transistor. The orthographic projection of the second gate line on the base substrate is between an orthographic projection of a first conductive portion on the base substrate and an orthographic projection of the enabling signal line on the base substrate. The at least one bridge portion further includes: a second bridge portion being connected to the fourth via-hole connection portion and the fifth connection portion through via holes, respectively, wherein an orthographic projection of the second bridge portion on the base substrate is between the orthographic projection of the enabling signal line on the base substrate and the orthographic projection of the first conductive portion on the base substrate.

According to another aspect of the present disclosure, there is provided a display device including the display panel as described above.

It should be understood that the above general description and the following detailed descriptions are exemplary and explanatory only and do not limit the present disclosure.

BRIEF DESCRIPTION OF THE DRAWINGS

The accompanying drawings herein are incorporated into and form part of the specification, which show embodiments that are consistent with the present disclosure, and are used in conjunction with the specification to explain the principles of the present disclosure. It will be apparent that the accompanying drawings in the following description show only some of embodiments of the present disclosure, and that other drawings may be obtained from these drawings without creative effort by those of ordinary skill in the art.

DETAILED DESCRIPTION

Figures 1, 2:
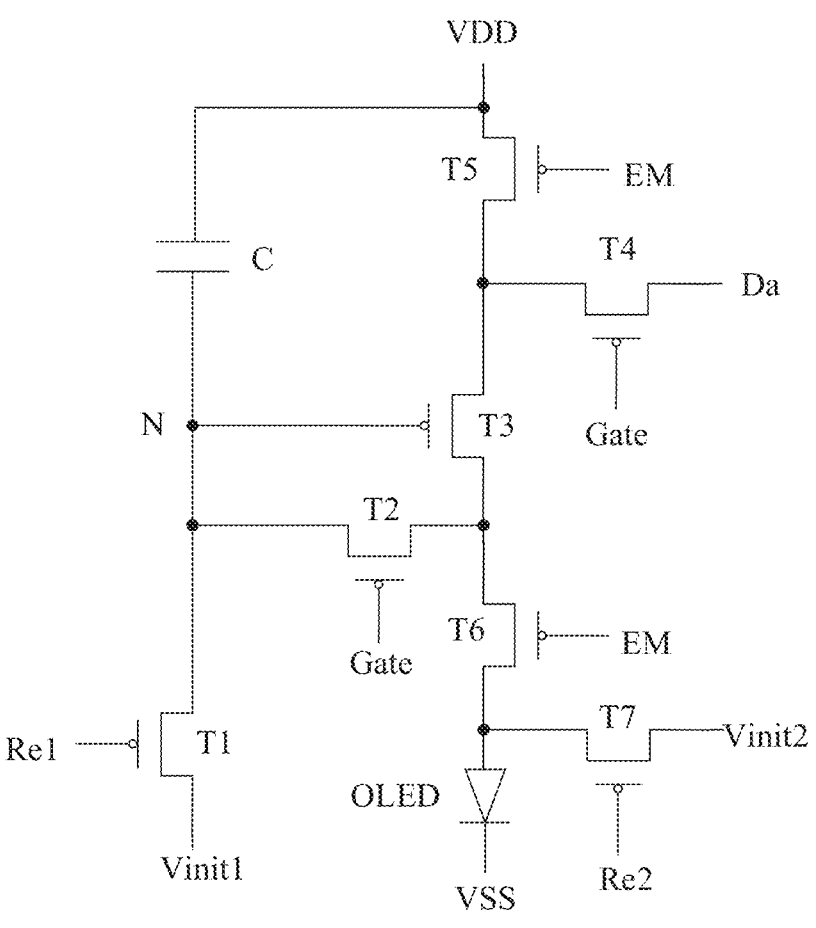
FIG. 1 is a schematic diagram of a circuit structure of a pixel driving circuit of a display panel according to an embodiment of the present disclosure.
FIG. 2 is a timing diagram of signals at respective nodes of the pixel driving circuit shown in FIG. 1 in one driving method.

Embodiments will now be described more fully with reference to the accompanying drawings. However, the embodiments can be implemented in a variety of forms and should not be construed as being limited to the embodiments set forth herein; rather, the provision of these embodiments makes the present disclosure comprehensive and complete and conveys the concept of the embodiments to those skilled in the art in a comprehensive manner. The same reference numerals in the drawings indicate the same or similar structures, and thus their detailed description will be omitted.

The terms "a/an", "one", and "the/said" are used to indicate the existence of one or more elements/components/etc. The terms "including" and "having" are used to indicate open-ended inclusion and to mean that additional elements/components/etc. may exist in addition to the listed elements/components/etc.

As shown in FIG. 1, it is a schematic diagram of a circuit structure of a pixel driving circuit of a display panel according to an embodiment of the present disclosure. The pixel driving circuit may include: a first transistor T1, a second transistor T2, a driver transistor T3, a fourth transistor T4, a fifth transistor T5, a sixth transistor T6, a seventh transistor T7, and a capacitor C. A first electrode of the first transistor T1 is connected to a first initial signal terminal Vinit1, a second electrode of the first transistor T1 is connected to a node N, and a gate of the first transistor T1 is connected to a first reset signal terminal Re1. A first electrode of the second transistor T2 is connected to the node N, a second electrode of the second transistor T2 is connected to a first electrode of the driver transistor T3, and a gate of the second transistor T2 is connected to a gate drive signal terminal Gate. A gate of the driver transistor T3 is connected to the node N. A first electrode of the fourth transistor T4 is connected to a data signal terminal Da, a second electrode of the fourth transistor T4 is connected to a second electrode of the driver transistor T3, and a gate of the fourth transistor T4 is connected to a gate drive signal terminal Gate. A first electrode of the fifth transistor T5 is connected to a first power supply terminal VDD, a second electrode of the fifth transistor T5 is connected to the second electrode of the driver transistor T3, and a gate of the fifth transistor T5 is connected to an enabling signal terminal EM. A first electrode of the sixth transistor T6 is connected to the first electrode of the driver transistor T3, and a gate of the sixth transistor T6 is connected to an enabling signal terminal EM. A first electrode of the seventh transistor T7 is connected to a second initial signal terminal Vinit2, a second electrode of the seventh transistor T7 is connected to a second electrode of the sixth transistor T6, and a gate of the seventh transistor T7 is connected to a second reset signal terminal Re2. A capacitor C is connected between the gate of the driver transistor T3 and the first power supply terminal VDD. The pixel driving circuit may be connected to a light emitting unit OLED for driving the light emitting unit OLED to emit light, and the light emitting unit OLED may be connected between the second electrode of the sixth transistor T6 and a second power supply terminal Vss. The first transistor T1, the second transistor T2, the driver transistor T3, the fourth transistor T4, the fifth transistor T5, the sixth transistor T6, and the seventh transistor T7 may all be P-type transistors.

As shown in FIG. 2, it is a timing diagram of signals at respective nodes of the pixel driving circuit shown in FIG. 1 in one driving method. "Gate" denotes a timing diagram of a signal on the gate drive signal terminal Gate. "Re1" denotes a timing diagram of a signal on the first reset signal terminal Re1. "Re2" denotes a timing diagram of a signal on the second reset signal terminal Re2. "EM" denotes a timing diagram of a signal on the enabling signal terminal EM. "Da" denotes a timing diagram of a signal on the data signal terminal Da. The driving method of the pixel driving circuit may include a reset phase t1, a compensation phase t2, and a light-emitting phase t3. In the reset phase t1: the first reset signal terminal Re1 outputs a low-level signal, the first transistor T1 is turned on, and the first initial signal terminal Vinit1 inputs a first initial signal to the node N. In the compensation phase t2: the second reset signal terminal Re2 and the gate drive signal terminal Gate output low-level signals, the fourth transistor T4, the second transistor T2, and the seventh transistor T7 are turned on, and at the same time, the data signal terminal Da outputs a data signal in order to write a voltage Vdata+Vth to the node N, wherein Vdata is a voltage of the data signal, and Vth is a threshold voltage of the driver transistor T3, and the second initial signal terminal Vini2 inputs a second initial signal to the second electrode of the sixth transistor T6. In the light-emitting phase t3: the enabling signal terminal EM outputs a low-level signal, the sixth transistor T6 and the fifth transistor T5 are turned on, and the driver transistor T3 drives the light emitting unit to emit light under the action of the voltage Vdata+Vth at the node N. According to an output current formula of the driver transistor. $I=(\mu WCox/2L)(Vgs-Vth)^2$, wherein $\mu$ denotes the carrier mobility. Cox denotes the gate capacitance per unit area. W denotes the width of the channel of the driver transistor. L denotes the length of the channel of the driver transistor, Vgs denotes the voltage difference between the gate and the source of the driver transistor, and Vth denotes the threshold voltage of the driver transistor. The output current I of the driver transistor in the pixel driving circuit of the present disclosure equals to $(\mu WCox/2L)(Vdata+Vth-Vdd-Vth)^2$, i.e., $I=(\mu WCox/2L)(Vdata+Vth-Vdd-Vth)^2$. The pixel driving circuit is capable of avoiding the effect of the threshold value of the driver transistor on its output current. It should be understood that in other embodiments, the pixel driving circuit may be provided with other driving methods, for example, the first transistor T1 and the seventh transistor T7 may both be turned on during the reset phase.

Figure 3:
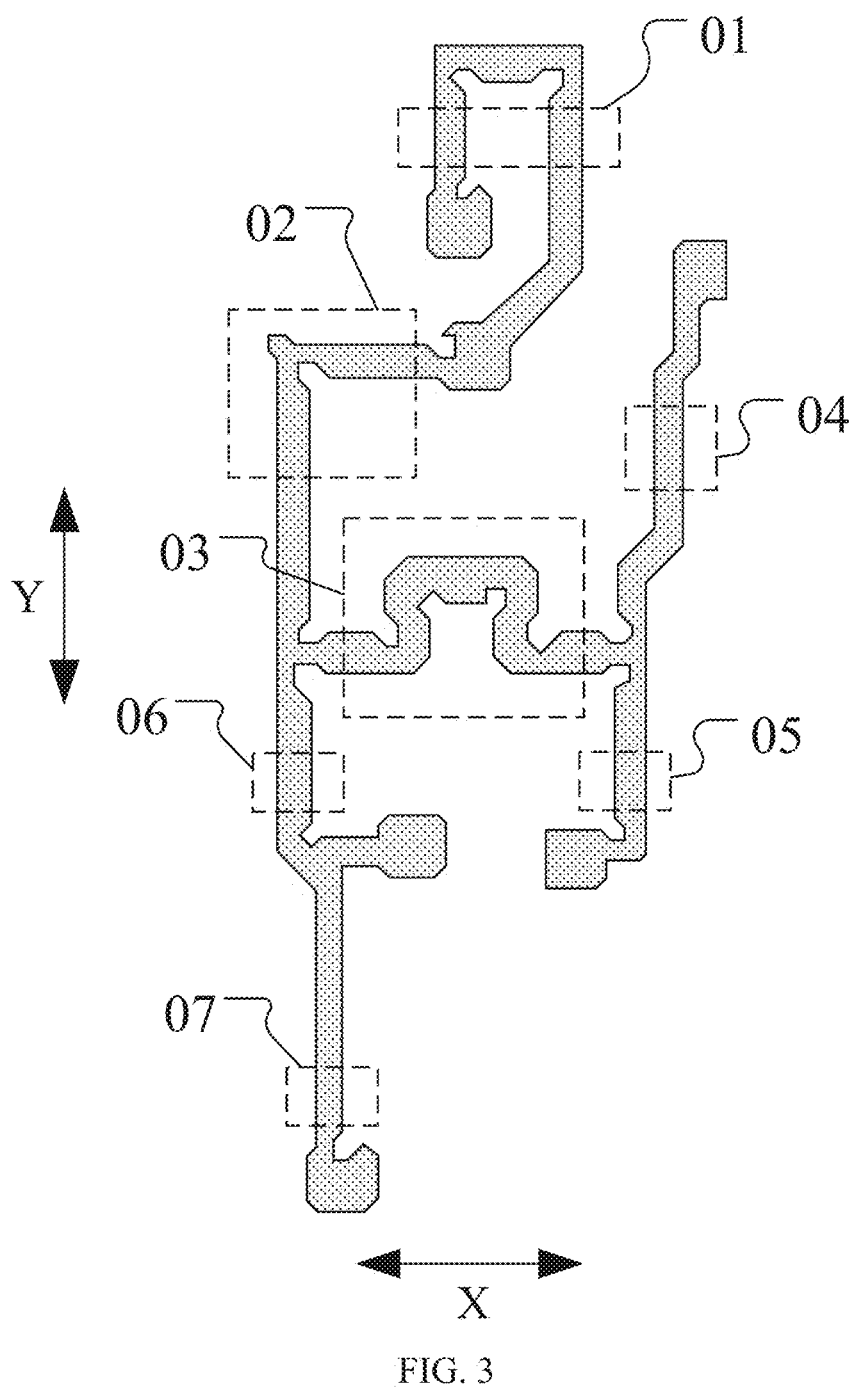
FIG. 3 is a structural layout of an active layer of a display panel in the related art.

A structural layout of an active layer of a display panel in the related art is shown in FIG. 3. The display panel may include a pixel driving circuit as shown in FIG. 1. In the related art, the active layer includes an active portion 01, an active portion 02, an active portion 03, an active portion 04, an active portion 05, an active portion 06, and an active portion 07. The active portion 01 is used to form a channel region of the first transistor T1, the active portion 02 is used to form a channel region of the second transistor T2, the active portion 03 is used to form a channel region of the driver transistor T3, the active portion 04 is used to form a channel region of the fourth transistor T4, the active portion 05 is used to form a channel region of the fifth transistor T5, the active portion 06 is used to form a channel region of the sixth transistor T6, and the active portion 07 is used to form a channel region of the seventh transistor T7. The other structures of the active layer except the channel regions are conductive traces, i.e., the source and drain of each transistor are connected to each other by the conductive trace of the active layer. However, due to the large sheet resistance of the conductive trace in the active layer, the fluctuation in the film thickness and size of the active layer caused by the manufacturing process may cause the large fluctuation in the resistance of the conductive trace. For example, when the thickness of the conductive trace or film fluctuates by 10% during the process preparation, the resistance of the conductive trace fluctuates by 0.36%, and due to the large resistance of the conductive trace itself, the actual value of the resistance fluctuation of the conductive trace is also large, so the resistance fluctuation of the conductive trace may have a large impact on the overall resistance of the current path of the pixel driving circuit during the driving process. For example, in the light-emitting phase, the first power supply terminal VDD, the fifth transistor T5, the driver transistor T3, and the sixth transistor T6 form a current path (i.e., the first power supply terminal VDD—the fifth transistor T5—the driver transistor T3—the sixth transistor T6), and if the resistances of the above current paths in respective pixel driving circuits are inconsistent under the same gray scale, it may result in inconsistent driving currents output from the respective pixel driving circuits, which ultimately leads the display panel's mura problem (i.e., uneven display brightness) and sandy mura problem (i.e., uneven brightness brought by the graininess). Similarly, inconsistent resistances in the current paths during the reset phase and data writing phase may also lead to the display panel's mura problem and sandy mura problem.

Figure 4:
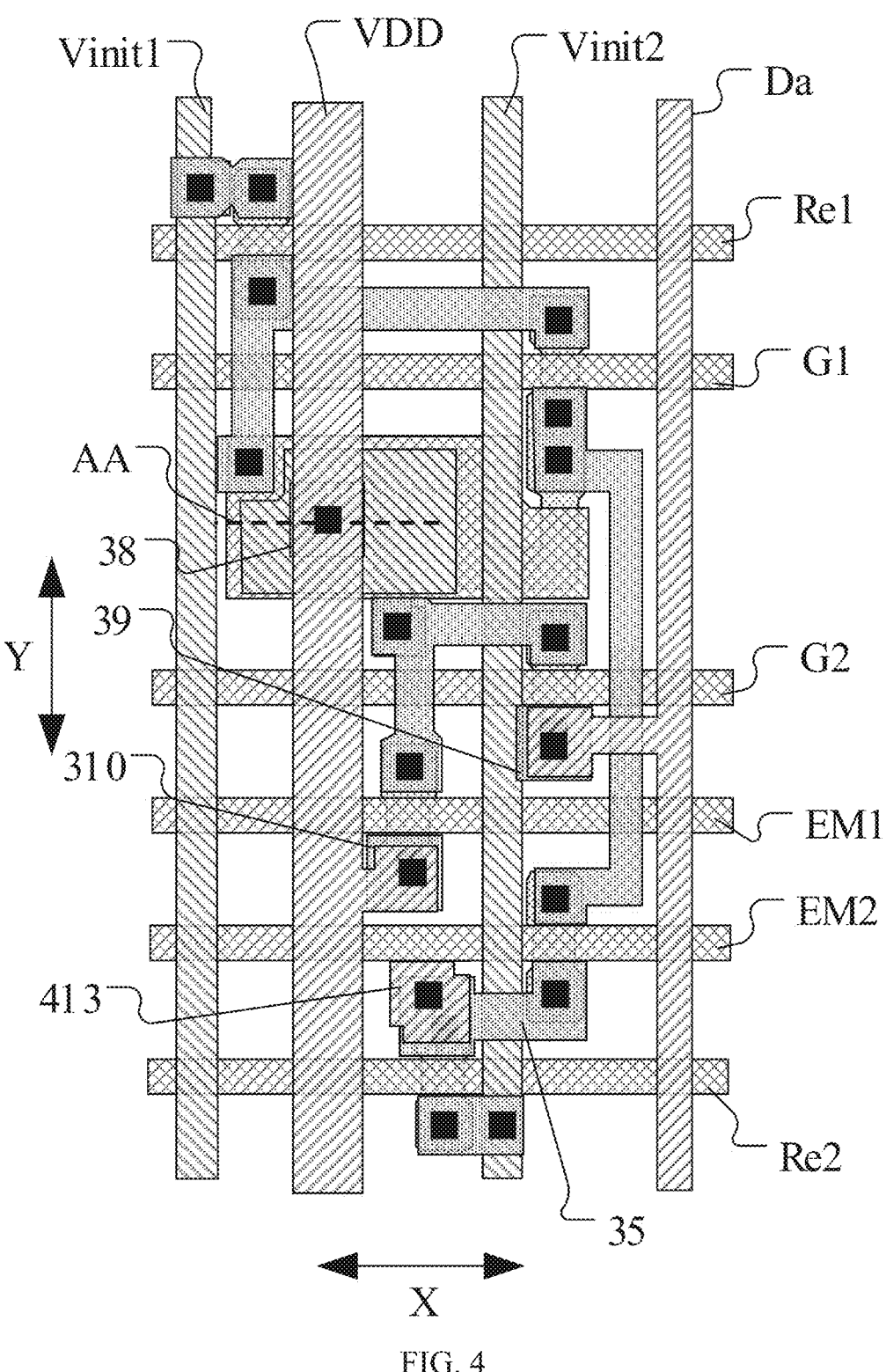
FIG. 4 is a structural layout of a display panel according to an embodiment of the present disclosure.
Figure 5:
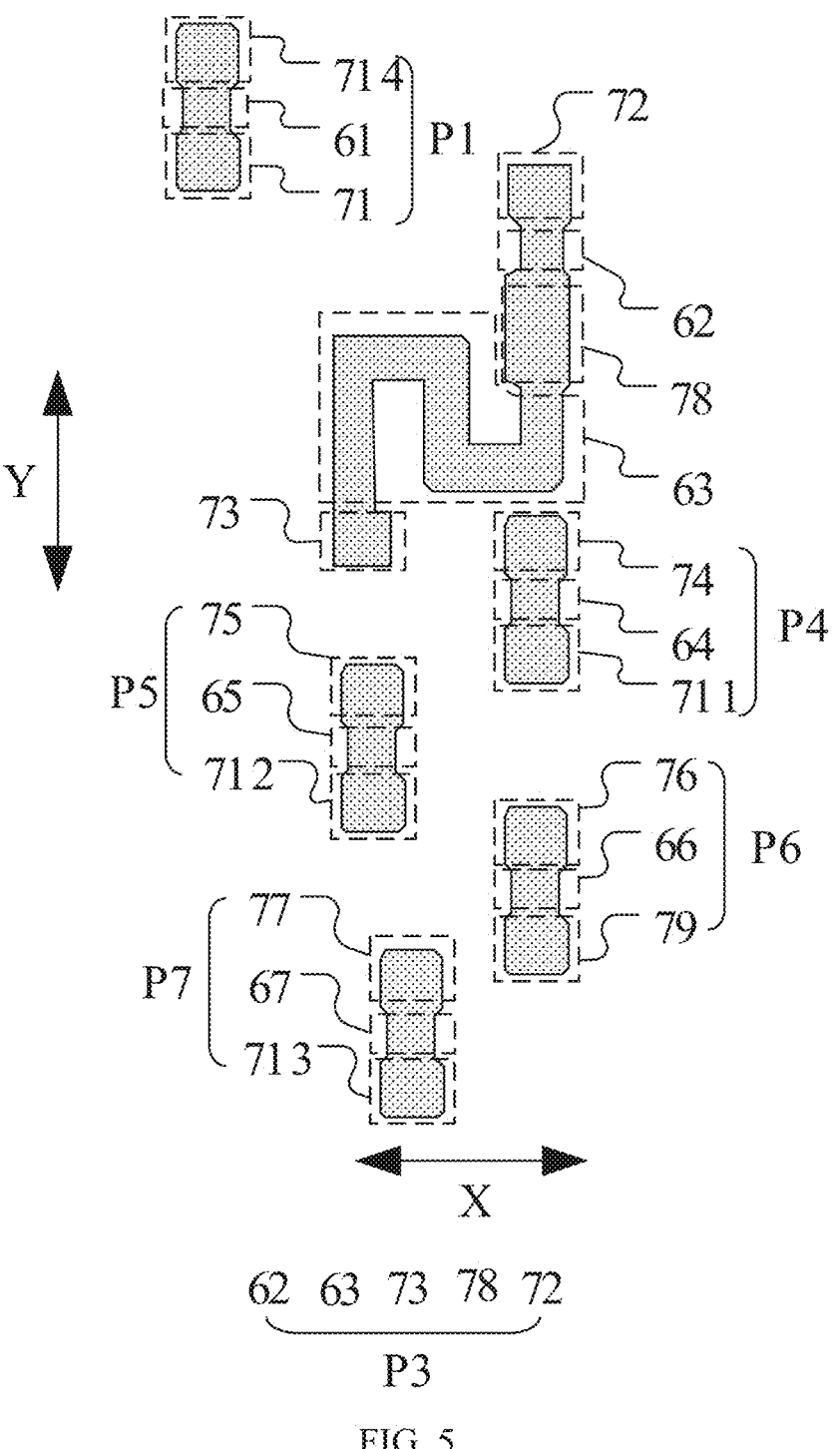
FIG. 5 is a structural layout of a first active layer of FIG. 4.
Figure 6:
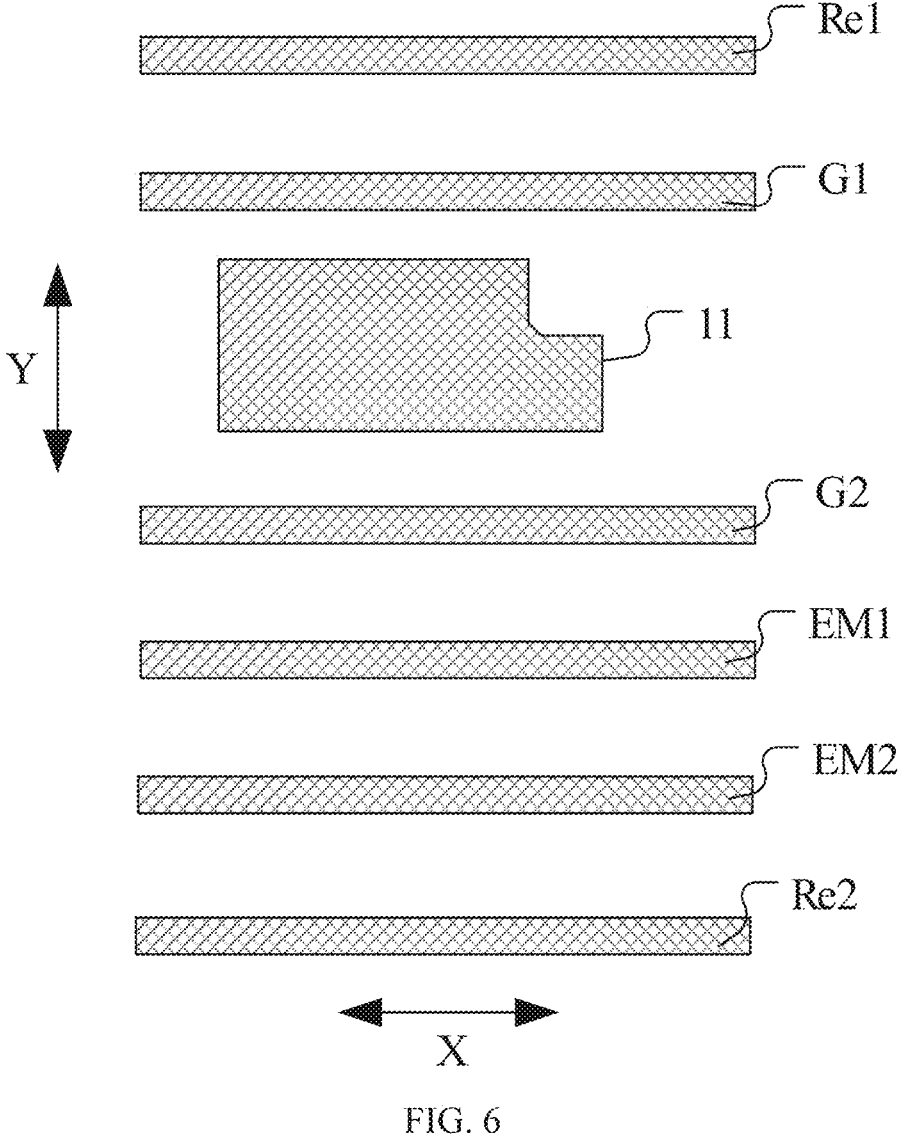
FIG. 6 is a structural layout of a first conductive layer of FIG. 4.
Figure 7:
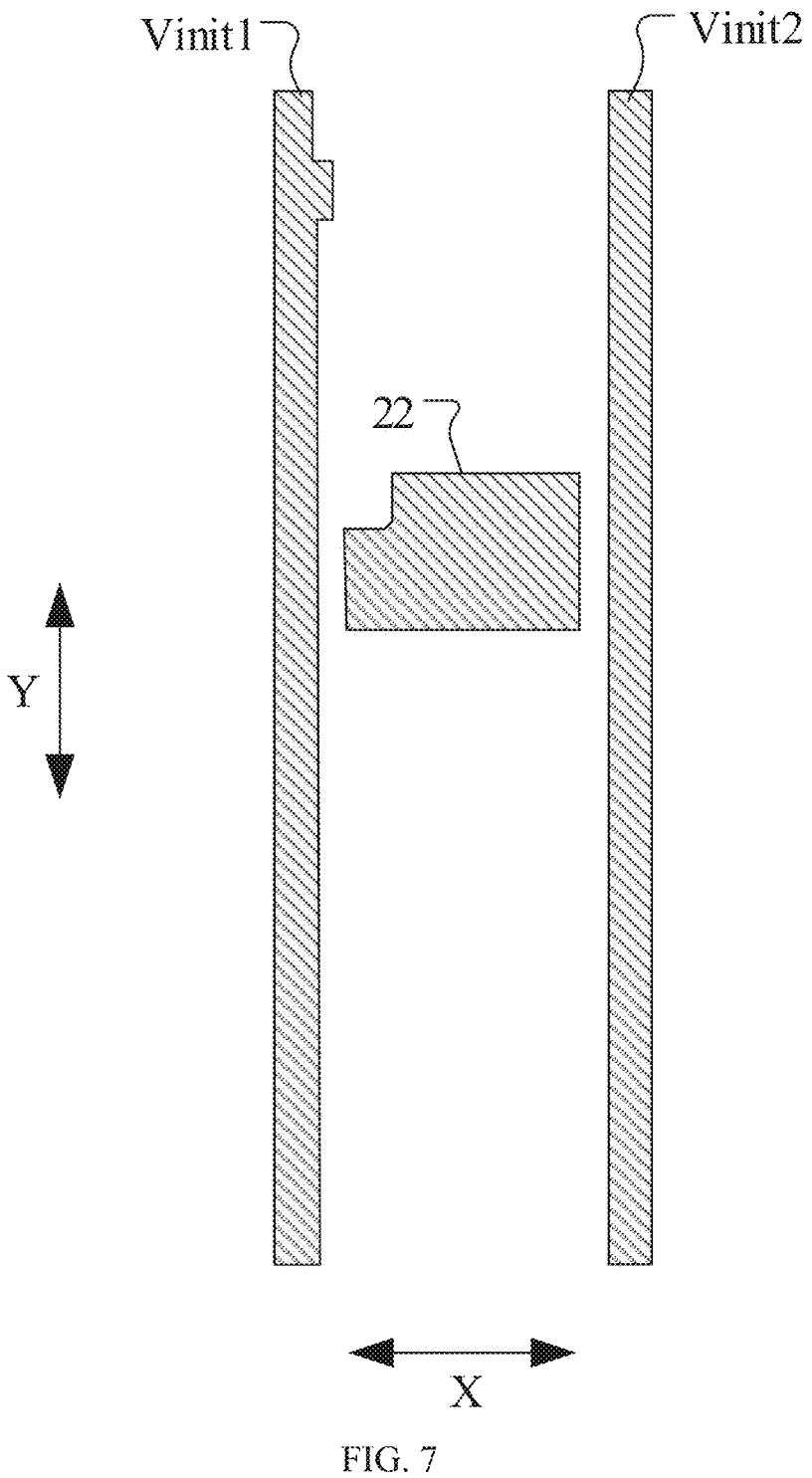
FIG. 7 is a structural layout of a second conductive layer of FIG. 4.
Figure 8:
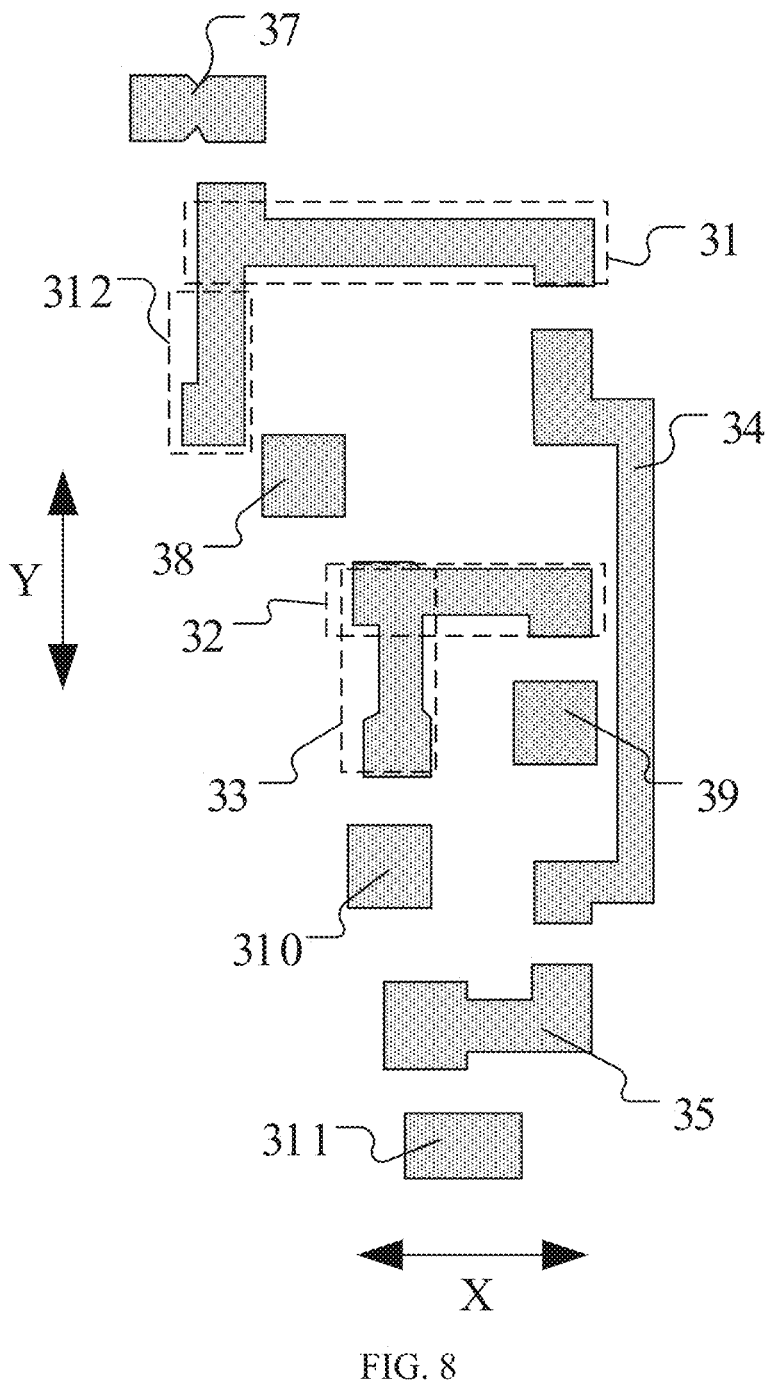
FIG. 8 is a structural layout of a third conductive layer of FIG. 4.
Figure 9:
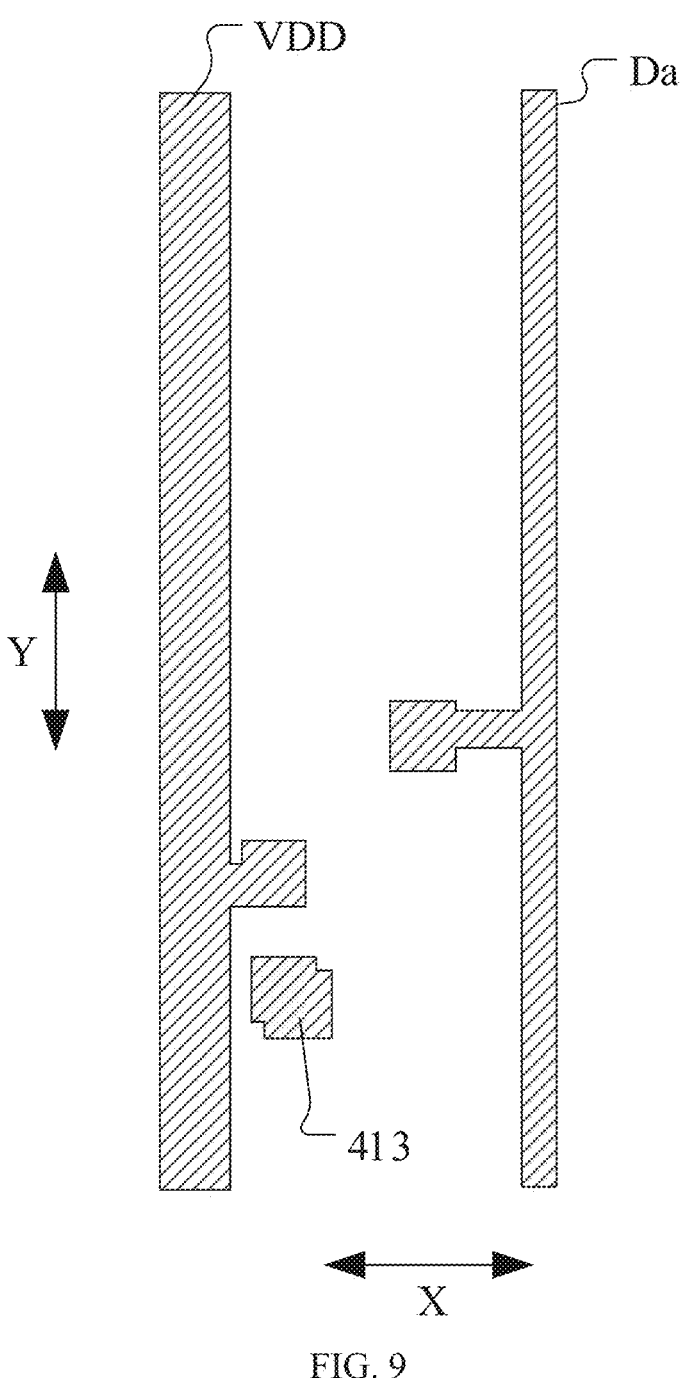
FIG. 9 is a structural layout of a fourth conductive layer of FIG. 4.
Figure 10:
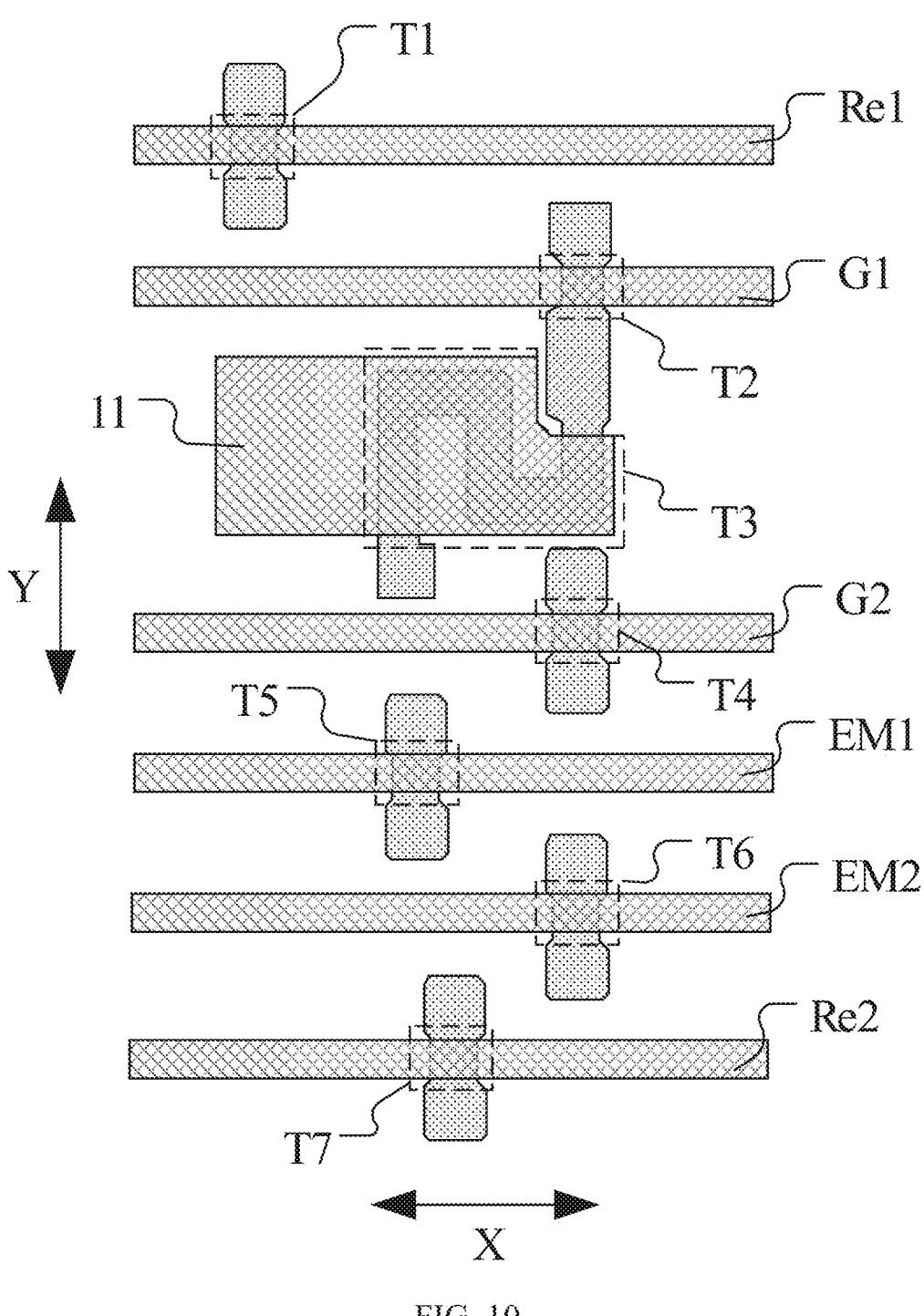
FIG. 10 is a structural layout of the first active layer and the first conductive layer of FIG. 4.
Figure 11:
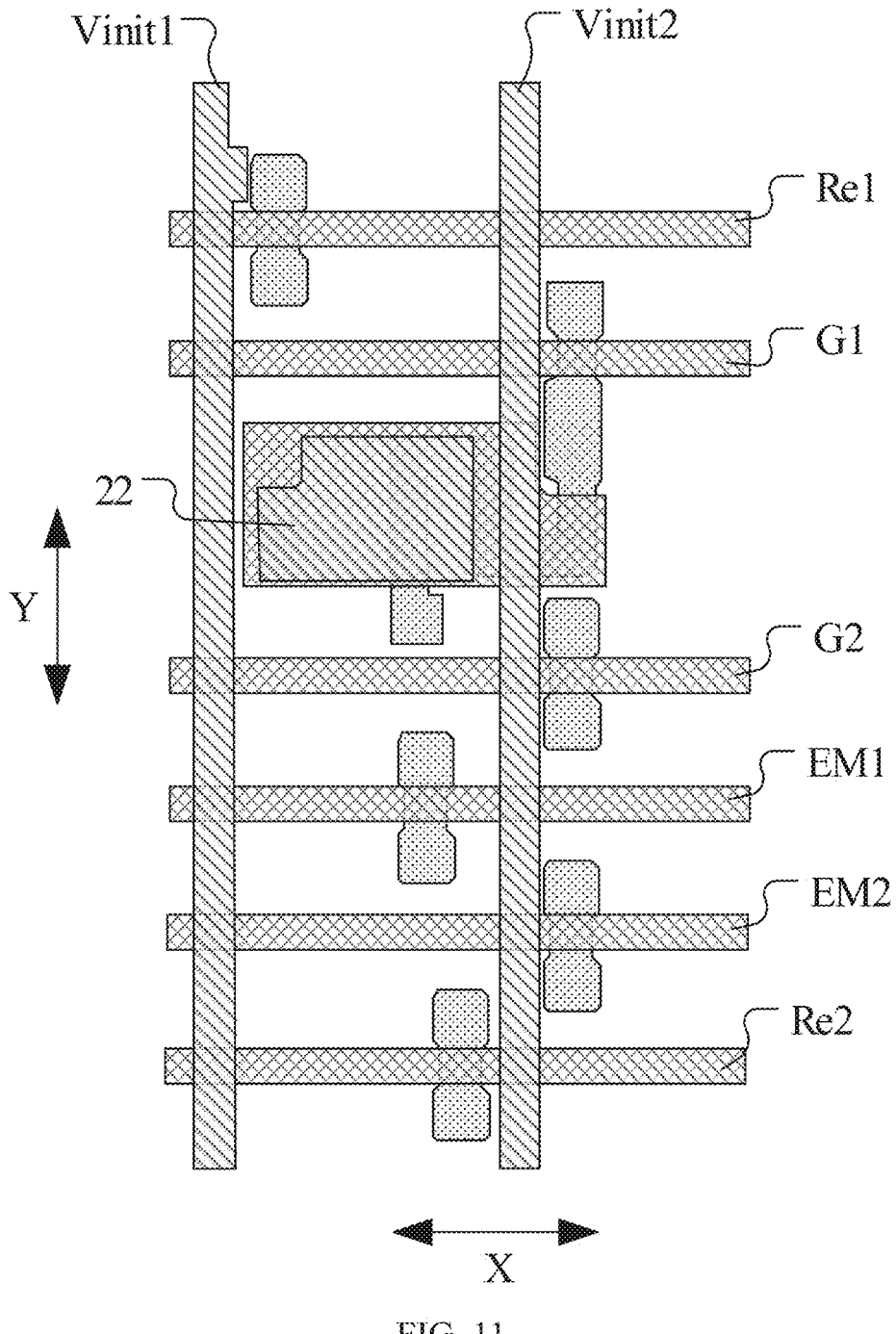
FIG. 11 is a structural layout of the first active layer, the first conductive layer, and the second conductive layer of FIG. 4.
Figure 12:
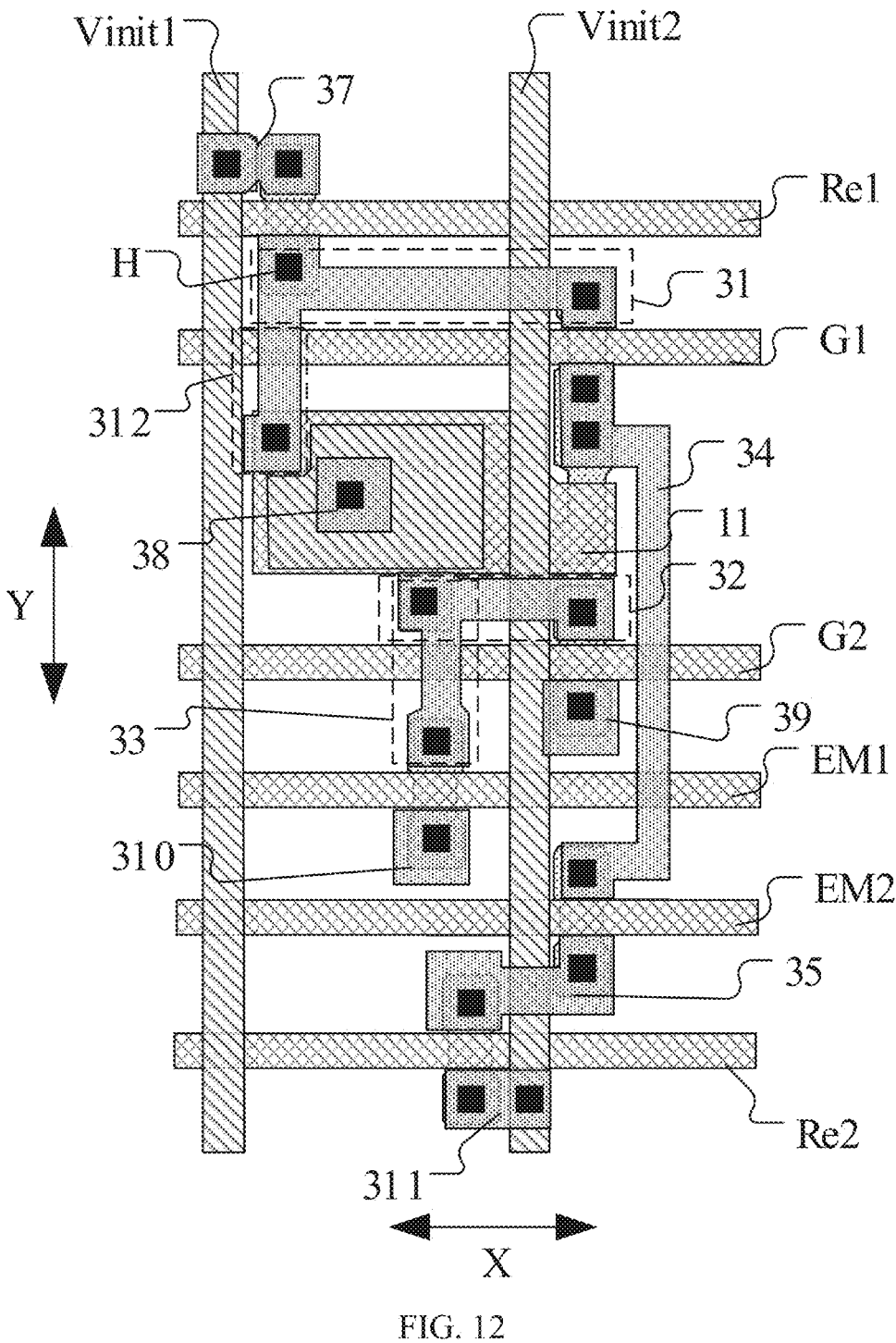
FIG. 12 is a structural layout of the first active layer, the first conductive layer, the second conductive layer, and the third conductive layer of FIG. 4.

In view of the above, the embodiment provides a display panel, which may include the pixel driving circuit shown in FIG. 1. The display panel may also include a base substrate, a first active layer, a first conductive layer, a second conductive layer, a third conductive layer, and a fourth conductive layer that are stacked in sequence, and one or more insulating layers may be disposed between the above layer structures. As shown in FIGS. 4 to 12. FIG. 4 is a structural layout of a display panel according to an embodiment of the present disclosure. FIG. 5 is a structural layout of a first active layer in FIG. 4. FIG. 6 is a structural layout of a first conductive layer in FIG. 4. FIG. 7 is a structural layout of a second conductive layer in FIG. 4. FIG. 8 is a structural layout of a third conductive layer in FIG. 4. FIG. 9 is a structural layout of a fourth conductive layer in FIG. 4, and FIG. 10 is a structural layout of the first active layer and the first conductive layer in FIG. 4. FIG. 11 is a structural layout of the first active layer, the first conductive layer, and the second conductive layer in FIG. 4, and FIG. 12 is a structural layout of the first active layer, the first conductive layer, the second conductive layer, and the third conductive layer in FIG. 4.

As shown in FIGS. 4, 5, and 10, the first active layer may include: a first active portion P1, a third active portion P3, a fourth active portion P4, a fifth active portion P5, a sixth active portion P6, and a seventh active portion P7 that are spaced apart from each other. The first active portion P1 includes a first sub-active portion 61 and a first via-hole connection portion 71 and a fourteenth via-hole connection portion 714 connected at both ends of the first sub-active portion 61. The third active portion P3 includes a second sub-active portion 62, a third sub-active portion 63, an eighth via-hole connection portion 78 connected between the third sub-active portion 63 and the second sub-active portion 62, a third via-hole connection portion 73 connected to an end of the third sub-active portion 63 away from the second sub-active portion 62, and a second via-hole connection portion 72 connected to an end of the second sub-active portion 62 away from the third sub-active portion 63. The fourth active portion P4 includes a fourth sub-active portion 64, and a fourth via-hole connection portion 74 and an eleventh via-hole connection portion 711 connected to both ends of the fourth sub-active portion 64. The fifth active portion P5 includes a fifth sub-active portion 65, and a fifth via-hole connection portion 75 and a twelfth via-hole connection portion 712 connected to both ends of the fifth sub-active portion 65. The sixth active portion P6 includes a sixth sub-active portion 66, and a sixth via-hole connection portion 76 and a ninth via-hole connection portion 79 connected to both ends of the sixth sub-active portion 66. The seventh active portion P7 includes a seventh sub-active portion 67, and a seventh via-hole connection portion 77 and a thirteenth via-hole connection portion 713 connected to both ends of the seventh sub-active portion 67. The first sub-active portion 61 is used to form the channel region of the first transistor T1, the second sub-active portion 62 is used to form the channel region of the second transistor T2, the third sub-active portion 63 is used to form the channel region of the driver transistor T3, the fourth sub-active portion 64 is used to form the channel region of the fourth transistor T4, the fifth sub-active portion 65 is used to form the channel region of the fifth transistor T5, the sixth sub-active portion 66 is used to form the channel region of the sixth transistor T6, and the seventh sub-active portion 67 is used to form the channel region of the seventh transistor T7. As shown in FIG. 5, the third sub-active portion 63 may be provided in a bent shape because the driver transistor T3 needs to operate in a saturation region and the channel region of the driver transistor T3 needs to have a large length-width ratio. The first active layer may be formed from a polysilicon material, and accordingly, the first transistor T1, the second transistor T2, the driver transistor T3, the fourth transistor T4, the fifth transistor T5, the sixth transistor T6, and the seventh transistor T7 may be P-type low-temperature polycrystalline silicon thin-film transistors.

As shown in FIGS. 4, 6, and 10, the first conductive layer may include a first reset signal line Re1, a first gate line G1, a second gate line G2, a first enabling signal line EM1, a second enabling signal line EM2, a second reset signal line Re2, and a first conductive portion 11. An orthographic projection of the first reset signal line Re1 on the base substrate, an orthographic projection of the first gate line G1 on the base substrate, an orthographic projection of the second gate line G2 on the base substrate, an orthographic projection of the first enabling signal line EM1 on the base substrate, an orthographic projection of the second enabling signal line EM2 on the base substrate, and an orthographic projection of the second reset signal line Re2 on the base substrate may all extend along a first direction X. The first reset signal line Re1 is used to provide a first reset signal terminal. The second reset signal line Re2 is used to provide a second reset signal terminal. The first gate line G1 is used to provide a gate drive signal terminal to the second transistor T2. The second gate line G2 is used to provide a gate drive signal terminal to the fourth transistor T4. The first gate line G1 and the second gate line G2 may receive the same drive signal. The first enabling signal line EM1 is used to provide an enabling signal terminal to the fifth transistor T5. The second enabling signal line EM2 is used to provide an enabling signal terminal to the sixth transistor T6. The first enabling signal line EM1 and the second enabling signal line EM2 may receive the same drive signal. The orthographic projection of the first reset signal line Re1 on the base substrate covers the orthographic projection of the first sub-active portion 61 on the base substrate, and a portion of the structure of the first reset signal line Re1 is used to form the gate of the first transistor T1. The orthographic projection of the second reset signal line Re2 on the base substrate covers the orthographic projection of the seventh sub-active portion 67 on the base substrate, and a portion of the structure of the second reset signal line Re2 is used to form the gate of the seventh transistor T7. The orthographic projection of the first gate line G1 on the base substrate covers the orthographic projection of the second sub-active portion 62 on the base substrate, and a portion of the structure of the first gate line G1 is used to form the gate of the second transistor T2. The orthographic projection of the second gate line G2 on the base substrate covers the orthographic projection of the fourth sub-active portion 64 on the base substrate, and a portion of the structure of the second gate line G2 is used to form the gate of the fourth transistor T4. The orthographic projection of the first enabling signal line EM1 on the base substrate covers the orthographic projection of the fifth sub-active portion 65 on the base substrate, and a portion of the structure of the first enabling signal line EM1 is used to form the gate of the fifth transistor T5. The orthographic projection of the second enabling signal line EM2 on the base substrate covers the orthographic projection of the sixth sub-active portion 66 on the base substrate, and a portion of the structure of the second enabling signal line EM2 is used to form the gate of the sixth transistor T6. The orthographic projection of the first conductive portion 11 on the base substrate covers the orthographic projection of the third sub-active portion 63 on the base substrate, and the first conductive portion 11 is used to form the gate of the driver transistor T3, and furthermore, the first conductive portion 11 may be reused as the second electrode of the capacitor C. In this embodiment, the orthographic projection of a certain structure on the base substrate extends in a certain direction, which can be understood as, the orthographic projection of the structure on the base substrate extends straight or bent in that direction. In addition, the display panel may use the first conductive layer as a mask to perform conductive processing on the first active layer, i.e., a region of the first active layer covered by the first conductive layer may form a channel region of a transistor, and a region of the first active layer not covered by the first conductive layer forms a via-hole connection portion.

As shown in FIGS. 4, 7, and 11, the second conductive layer may include a first initial signal line Vinit1, a second initial signal line Vinit2, and a second conductive portion 22.

An orthographic projection of the first initial signal line Vinit1 on the base substrate, and an orthographic projection of the second initial signal line Vinit2 on the base substrate may extend along a second direction Y. The second direction Y may intersect the first direction X, e.g., the first direction X may be a row direction and the second direction Y may be a column direction. In this embodiment, the display panel is provided with a larger number of gate drive signal lines extending in the first direction, for example, the first reset signal line Re1, the first gate line G1, the second gate line G2, the first enabling signal line EM1, the second enabling signal line EM2, and the second reset signal line Re2 all extend in the first direction X. Since the pixel driving circuit already has a large size in the second direction Y, in this embodiment, the first initial signal line Vinit1 and the second initial signal line Vinit2 are extended along the second direction Y to reduce the size of the pixel driving circuit in the second direction. The first initial signal line Vinit1 may be used to provide a first initial signal terminal, and the second initial signal line Vinit2 may be used to provide a second initial signal terminal. An orthographic projection of the second conductive portion 22 on the base substrate may be overlapped with the orthographic projection of the first conductive portion 11 on the base substrate, and the second conductive portion 22 may be used to form a first electrode of the capacitor C.

As shown in FIGS. 4, 8, and 12, the third conductive layer may include a first bridge portion 31, a second bridge portion 32, a third bridge portion 33, a fourth bridge portion 34, a fifth bridge portion 35, a seventh bridge portion 37, an eighth bridge portion 38, a ninth bridge portion 39, a tenth bridge portion 310, an eleventh bridge portion 311, and a twelfth bridge portion 312. The first bridge portion 31 may be connected to the first via-hole connection portion 71 and the second via-hole connection portion 72 through via holes H, respectively, in order to connect the second electrode of the first transistor T1 and the first electrode of the second transistor. The black square indicates the position of the via hole. The second bridge portion 32 may be connected to the third via-hole connection portion 73 and the fourth via-hole connection portion 74 through via holes, respectively, in order to connect the second electrode of the driver transistor T3 and the second electrode of the fourth transistor T4. The third bridge portion 33 may be connected to the third via-hole connection portion 73 and the fifth via-hole connection portion 75 through via holes, respectively, in order to connect the second electrode of the driver transistor T3 and the second electrode of the fifth transistor T5. The fourth bridge portion 34 may be connected to the eighth via-hole connection portion 78 and the sixth via-hole connection portion 76 through via holes, respectively, in order to connect the first electrode of the driver transistor and the first electrode of the sixth transistor. The fifth bridge portion 35 may be connected to the seventh via-hole connection portion 77 and the ninth via-hole connection portion 79 through via holes, respectively, in order to connect the second electrode of the sixth transistor T6 and the second electrode of the seventh transistor T7. The seventh bridge portion 37 may be connected to the first initial signal line Vinit1 and the fourteenth via-hole connection portion 714 through via holes, respectively, in order to connect the first electrode of the first transistor T1 and the first initial signal terminal. The eighth bridge portion 38 is connected to the second conductive portion 22 through a via hole, in order to connect the first electrode of the capacitor C. The ninth bridge portion 39 is connected to the eleventh via-hole connection portion 711 through a via hole, in order to connect the first electrode of the fourth transistor T4. The tenth bridge portion 310 is connected to the twelfth via-hole connection portion 712 through a via hole, in order to connect the first electrode of the fifth transistor T5. The eleventh bridge portion 311 is connected to the second initial signal line Vinit2 and the thirteenth via-hole connection portion 713 through via holes, respectively, in order to connect the second initial signal terminal and the first terminal of the seventh transistor T7. The twelfth bridge portion 312 is connected to the first bridge portion 31 and the twelfth bridge portion 312 is connected to the first conductive portion 11 through a via hole, in order to connect the gate of the driver transistor, the second electrode of the first transistor T1, and the first electrode of the second transistor. As shown in FIGS. 4, 8, and 12, the second bridge portion 32 and the third bridge portion 33 may share a portion of the conductive portion and be connected to the third via-hole connection portion 73 through the same via hole through the shared conductive portion.

As shown in FIGS. 4, 8, and 12, the orthographic projection of the first reset signal line Re1 on the base substrate is located on a side of the orthographic projection of the first gate line G1 on the base substrate away from the orthographic projection of the first conductive portion 11 on the base substrate. The orthographic projection of the first bridge portion 31 on the base substrate may extend along the first direction X and be located between the orthographic projection of the first reset signal line Re1 on the base substrate and the orthographic projection of the first gate line G1 on the base substrate. The orthographic projection of the second gate line G2 on the base substrate is located on a side of the orthographic projection of the first conductive portion 11 on the base substrate away from the orthographic projection of the first gate line G1 on the base substrate. The orthographic projection of the second bridge portion 32 on the base substrate extends along the first direction X and is located between the orthographic projection of the first conductive portion 11 on the base substrate and the orthographic projection of the second gate line G2 on the base substrate. The orthographic projection of the first enabling signal line EM1 on the base substrate is located on a side of the orthographic projection of the second gate line G2 on the base substrate away from the orthographic projection of the first conductive portion 11 on the base substrate. The orthographic projection of the third bridge portion 33 on the base substrate extends along the second direction Y, and the orthographic projection of the third bridge portion 33 on the base substrate is located between the orthographic projection of the first conductive portion 11 on the base substrate and the orthographic projection of the first enabling signal line EM1 on the base substrate. The orthographic projection of the second enabling signal line EM2 on the base substrate is located on a side of the orthographic projection of the first enabling signal line EM1 on the base substrate away from the orthographic projection of the first conductive portion 11 on the base substrate. The orthographic projection of the fourth bridge portion 34 on the base substrate extends in the second direction Y, and the orthographic projection of the fourth bridge portion 34 on the base substrate is located between the orthographic projection of the first gate line G1 on the base substrate and the orthographic projection of the second enabling signal line EM2 on the base substrate. The orthographic projection of the second reset signal line Re2 on the base substrate is located on a side of the orthographic projection of the second enabling signal line EM2 on the base substrate away from the orthographic projection of the first conductive portion 11 on the base substrate. The orthographic projection of the fifth bridge portion 35 on the base substrate extends along the first direction X and is located between the orthographic projection of the second reset signal line Re2 on the base substrate and the orthographic projection of the second enabling signal line EM2 on the base substrate.

As shown in FIGS. 4 and 9, the fourth conductive layer may include a power line VDD, a data line Da, and a thirteenth bridge portion 413. An orthographic projection of the power line VDD on the base substrate, and an orthographic projection of the data line Da on the base substrate may extend in the second direction Y. The power line VDD may be used to provide a first power supply terminal, and the power line VDD may be connected to the eighth bridge portion 38 and the tenth bridge portion 310 through via holes, respectively, in order to connect the first power supply terminal, the first electrode of the fifth transistor T5, and the first electrode of the capacitor C. The data line Da may be used to provide a data signal terminal, and the data line Da may be connected to the ninth bridge portion 39 through a via hole, in order to connect the data signal terminal and the first electrode of the fourth transistor T4, The thirteenth bridge portion 413 may be connected to the fifth bridge portion 35 through a via hole, in order to connect the second electrode of the sixth transistor T6 and the second electrode of the seventh transistor T7. The thirteenth bridge portion 413 may be used to connect the first electrode of the light emitting unit OLED. As shown in FIG. 4, the orthographic projection of the second initial signal line Vinit2 on the base substrate is located between the orthographic projection of the data line Da on the base substrate and the orthographic projection of most of the structure of the first conductive portion 11 on the base substrate, and the second initial signal line Vinit2 may be shielded from the noise impact of the data line Da on the gate of the driver transistor. Similarly, the first initial signal line Vinit1 may shield the noise impact of the data line Da in a pixel driving circuit of the adjacent column on the gate of the driver transistor in the pixel driving circuit of the current column.

In this embodiment, the sheet resistance of the third conductive layer is smaller than the sheet resistance of the via-hole connection portion in the first active layer. The display panel is connected to a portion of the transistors by the bridge portions in the third conductive layer, so that the resistance of the traces between the transistors can be reduced. Thus, even if the film thickness and size of the bridge portion in the third conductive layer fluctuate during the manufacturing process, the fluctuation in resistance hardly affects the overall resistance of the current path during the driving process of the pixel driving circuit due to the small resistance of the bridge portion itself. In this way, this arrangement can greatly improve the display panel's mura problem (i.e., uneven display brightness) and sandy mura problem (i.e., uneven brightness brought by the graininess).

It should be understood that in other embodiments, the bridge portions being connected to the transistors may also be provided in the fourth conductive layer, and accordingly, the sheet resistance of the fourth conductive layer may be less than the sheet resistance of the via-hole connection portion in the first active layer.

In this embodiment, except for the second transistor T2 and the driver transistor T3, the transistors are connected to each other through the bridge portions of the third conductive layer. It should be understood that in other embodiments, any transistors in the pixel driving circuit may be connected to each other through the bridge portions of the third conductive layer. In addition, the display panel may also only connect any portion of the transistors in the pixel driving circuit to each other through the bridge portions of the third conductive layer. In other embodiments, the pixel driving circuit in the display panel may also be of other structures, for example, at least some of the first transistor, the second transistor, the fourth transistor, the fifth transistor, and the sixth transistor in FIG. 1 are N-type transistors. The transistors of the other circuits in the display panel may also be connected to each other through the bridge portions of the third conductive layer, for example, the transistors in the gate driving circuit, the electrostatic protection circuit, and the data selector in the display panel may also be connected to each other by the bridge portions of the third conductive layer.

It should be noted that, as shown in FIGS. 4 and 12, the black square drawn on the side of the fourth conductive layer facing away from the base substrate indicates the via hole of the fourth conductive layer connecting to other layers on the side of the fourth conductive layer facing the base substrate; and the black square drawn on the side of the third conductive layer facing away from the base substrate indicates the via hole of the third conductive layer connecting to other layers on the side of the third conductive layer facing the base substrate. The black square indicates only the position of the via hole, and the different via holes indicated by the black squares at different positions may penetrate through different insulating layers.

In this embodiment, except for the third active portion, other spaced-apart active portions may have the same shape and size, e.g., the first active portion P1, the fourth active portion P4, the fifth active portion P5, the sixth active portion P6, the seventh active portion P7 may have the same shape and size, and the sub-active portions used to form the channel regions in the active portions may also have the same shape and size. Since the first transistor T1, the fourth transistor T4, the fifth transistor T5, the sixth transistor T6, and the seventh transistor T7 adopt modularized structures, when designing the layout structure of the display panel, it is only necessary to input the corresponding equivalent circuit into the electronic auxiliary design software (e.g., the EDA tool software), and the electronic auxiliary design software can directly generate the layout structure corresponding to the pixel driving circuit.

Figure 13:
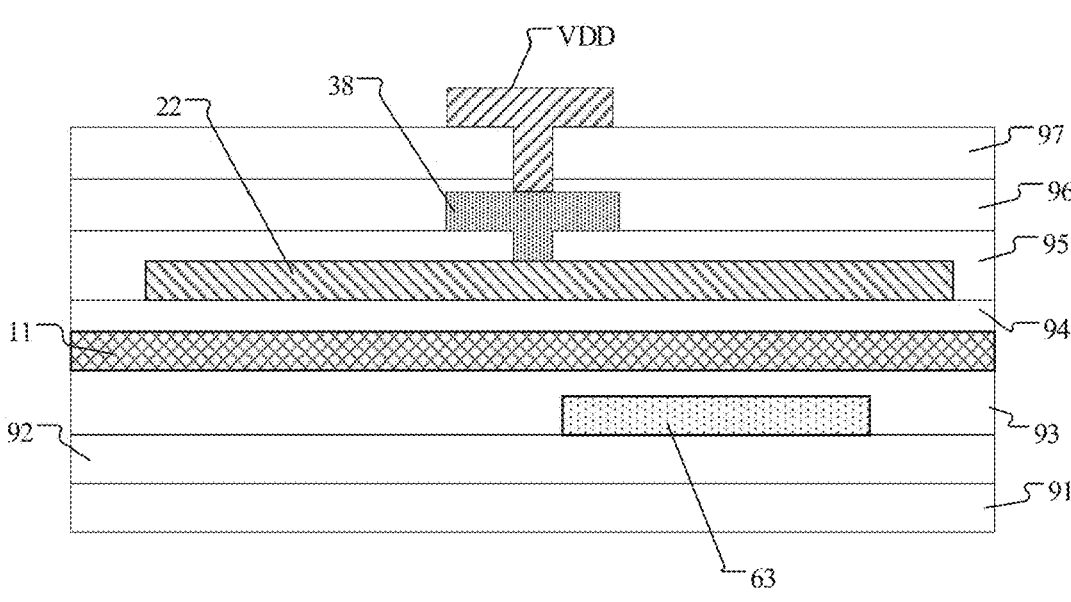
FIG. 13 is a partial cross-sectional view of the display panel shown in FIG. 4 along the dashed line AA.

As shown in FIG. 13, it is a partial cross-sectional view of the display panel shown in FIG. 4 along the dashed line AA. The display panel may further include a buffer layer 92, a first insulating layer 93, a second insulating layer 94, a first dielectric layer 95, a passivation layer 96, a second dielectric layer 97, wherein the base substrate 91, the buffer layer 92, the first active layer, the first insulating layer 93, the first conductive layer, the second insulating layer 94, the second conductive layer, the first dielectric layer 95, the third conductive layer, the passivation layer 96, the second dielectric layer 97, and a fourth conductive layer are stacked in sequence. The first insulating layer 93 and the second insulating layer 94 may be silicon oxide layers. The first dielectric layer 95 and the second dielectric layer 97 may be silicon nitride layers. The passivation layer 96 and the buffer layer 92 may be made of silicon oxide, silicon nitride, and the like. The base substrate 91 may include a glass substrate, a barrier layer, and a polyimide layer stacked in sequence, wherein the barrier layer may be made of an inorganic material. The material of the first conductive layer and the second conductive layer may be one of molybdenum, aluminum, copper, titanium, and niobium, or may be an alloy, or may be a molybdenum-titanium alloy, or may be a stacked layer of molybdenum and titanium, and the like. The material of the third conductive layer and the fourth conductive layer may include a metallic material, for example, may be one of molybdenum, aluminum, copper, titanium, and niobium, or may be an alloy, or may be a molybdenum-titanium alloy, or may be a stacked layer of molybdenum and titanium, etc., or it may be a stacked layer of titanium, aluminum, and titanium (i.e., titanium/aluminum/titanium).

Figure 14:
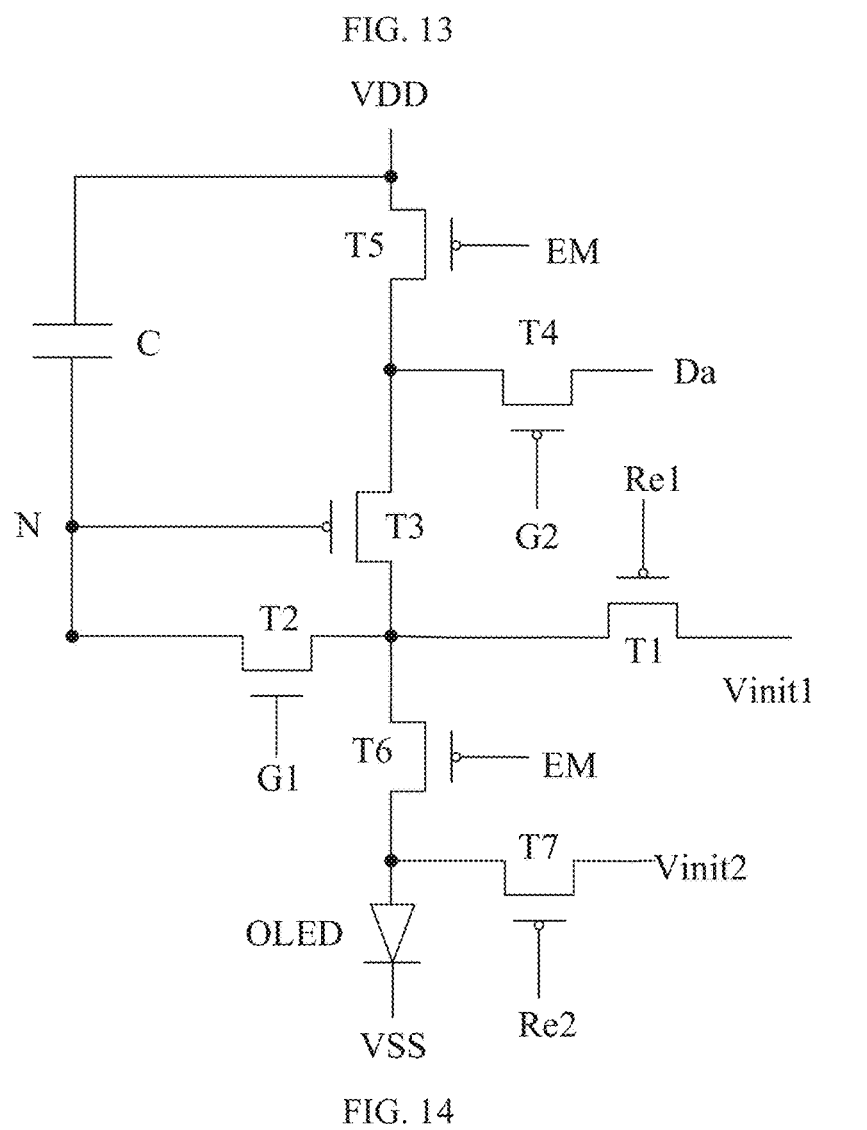
FIG. 14 is a schematic diagram of a circuit structure of a pixel driving circuit of a display panel according to another embodiment of the present disclosure.

As shown in FIG. 14, it is a schematic diagram of a circuit structure of a pixel driving circuit of a display panel according to another embodiment of the present disclosure. The pixel driving circuit may include: a first transistor T1, a second transistor T2, a driver transistor T3, a fourth transistor T4, a fifth transistor T5, a sixth transistor T6, a seventh transistor T7, and a capacitor C. A first electrode of the first transistor T1 is connected to a first initial signal terminal Vinit1, a second electrode of the first transistor T1 is connected to a first electrode of the driver transistor T3, and a gate of the first transistor T1 is connected to a first reset signal terminal Re1. A first electrode of the second transistor T2 is connected to a node N, a second electrode of the second transistor T2 is connected to the first electrode of the driver transistor T3, and a gate of the second transistor T2 is connected to a first gate drive signal terminal G1. A gate of the driver transistor T3 is connected to the node N. A first electrode of the fourth transistor T4 is connected to a data signal terminal Da, a second electrode of the fourth transistor T4 is connected to a second electrode of the driver transistor T3, and a gate of the fourth transistor T4 is connected to a second gate drive signal terminal G2. A first electrode of the fifth transistor T5 is connected to a first power supply terminal VDD, a second electrode of the fifth transistor T5 is connected to the second electrode of the driver transistor T3, and a gate of the fifth transistor T5 is connected to an enabling signal terminal EM. A first electrode of the sixth transistor T6 is connected to the first electrode of the driver transistor T3, and a gate of the sixth transistor T6 is connected to an enabling signal terminal EM. A first electrode of the seventh transistor T7 is connected to a second initial signal terminal Vinit2, a second electrode of the seventh transistor T7 is connected to a second electrode of the sixth transistor T6, and a gate of the seventh transistor T7 is connected to a second reset signal terminal Re2. The capacitor C is connected between the gate of the driver transistor T3 and the first power supply terminal VDD. The pixel driving circuit may be connected to a light emitting unit OLED for driving the light emitting unit OLED to emit light, and the light emitting unit OLED may be connected between the second electrode of the sixth transistor T6 and a second power supply terminal VSS. The first transistor T1, the driver transistor T3, the fourth transistor T4, the fifth transistor T5, the sixth transistor T6, and the seventh transistor T7 may be P-type transistors, and the second transistor T2 may be an N-type transistor.

Figure 15:
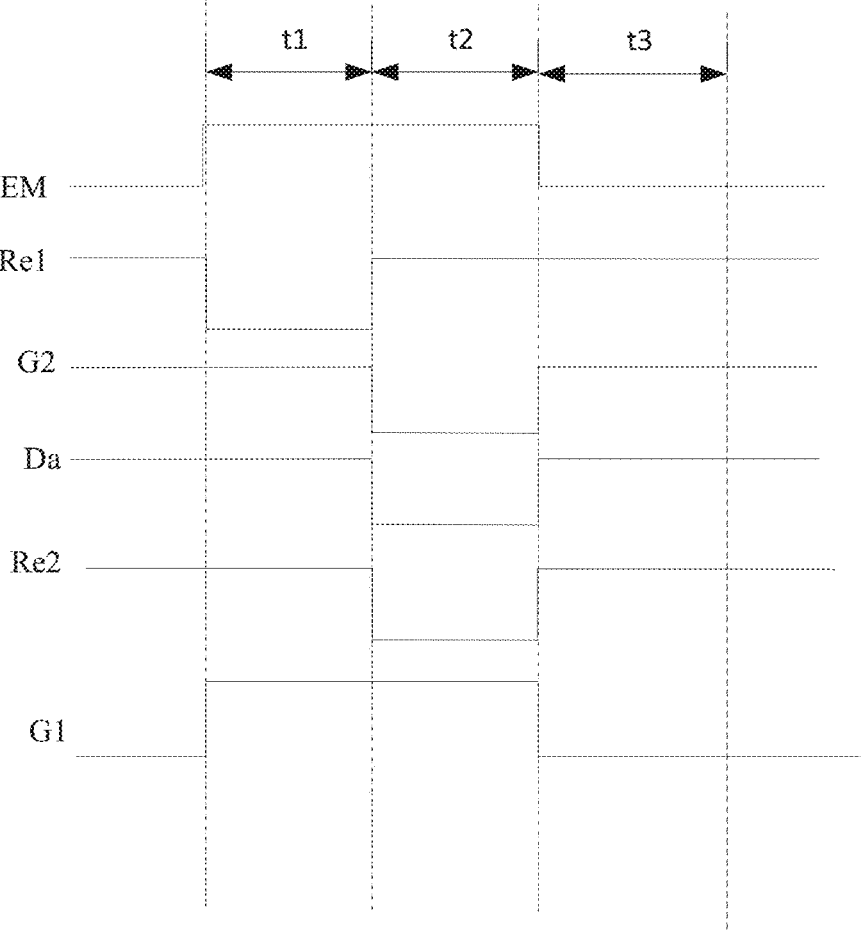
FIG. 15 is a timing diagram of signals at respective nodes of the pixel driving circuit shown in FIG. 14 in one driving method.

As shown in FIG. 15, it is a timing diagram of signals at respective nodes of the pixel driving circuit shown in FIG. 14 in one driving method. "G1" denotes a timing diagram of a signal on the first gate drive signal terminal. "G2" denotes a timing diagram of a signal on the second gate drive signal terminal. "Re1" denotes a timing diagram of a signal on the first reset signal terminal Re1. "Re2" denotes a timing diagram of a signal on the second reset signal terminal Re2. "EM" denotes a timing diagram of a signal on the enabling signal terminal EM. "Da" denotes a timing diagram of a signal on the data signal terminal Da. The driving method of the pixel driving circuit may include a reset phase t1, a compensation phase t2, and a light-emitting phase t3. In the reset phase t1: the first reset signal terminal Re1 outputs a low-level signal, the first gate drive signal terminal G1 outputs a high-level signal, the first transistor T1 and the second transistor T2 are turned on, and the first initial signal terminal Vinit1 inputs a first initial signal to the node N. In the compensation phase t2: the second reset signal terminal Re2 and the second gate drive signal terminal G2 output low-level signals, the first gate drive signal terminal G1 outputs a high-level signal, the fourth transistor T4, the second transistor T2, and the seventh transistor T7 are turned on, and at the same time the data signal terminal Da outputs a data signal in order to write a voltage Vdata+Vth to the node N, wherein Vdata is a voltage of the data signal. Vth is a threshold voltage of the driver transistor T3, and the second initial signal terminal Vini2 inputs a second initial signal to the second electrode of the sixth transistor T6. In the light-emitting phase t3: the enabling signal terminal EM outputs a low-level signal, the sixth transistor T6 and the fifth transistor T5 are turned on, and the driver transistor T3 drives the light emitting unit to emit light under the action of the voltage Vdata+Vth at the node N. According to an output current formula of the driver transistor, $I=(\mu WCox/2L)(Vgs-Vth)^2$, wherein $\mu$ denotes the carrier mobility, Cox denotes the gate capacitance per unit area, W denotes the width of the channel of the driver transistor, L denotes the length of the channel of the driver transistor, Vgs denotes the voltage difference between the gate and the source of the driver transistor, and Vth denotes the threshold voltage of the driver transistor. The output current I of the driver transistor in the pixel driving circuit of the present disclosure equals to $(\mu WCox/2L)(Vdata+Vth-Vdd-Vth)^2$, i.e., $I=(\mu WCox/2L)(Vdata+Vth-Vdd-Vth)^2$. The pixel driving circuit is capable of avoiding the effect of the threshold value of the driver transistor on its output current. Since the second transistor T2 is an N-type transistor, the second transistor T2 has a small turn-off leakage current so that the leakage current of the node N through the second transistor T2 during the light-emitting phase can be reduced. It should be understood that in other embodiments, the pixel driving circuit may be provided with other driving methods, for example, the first transistor T1 and the seventh transistor T7 may both be turned on during the reset phase.

Figure 18:
FIG. 18 is a structural layout of a first conductive layer of FIG. 16.
Figure 18:
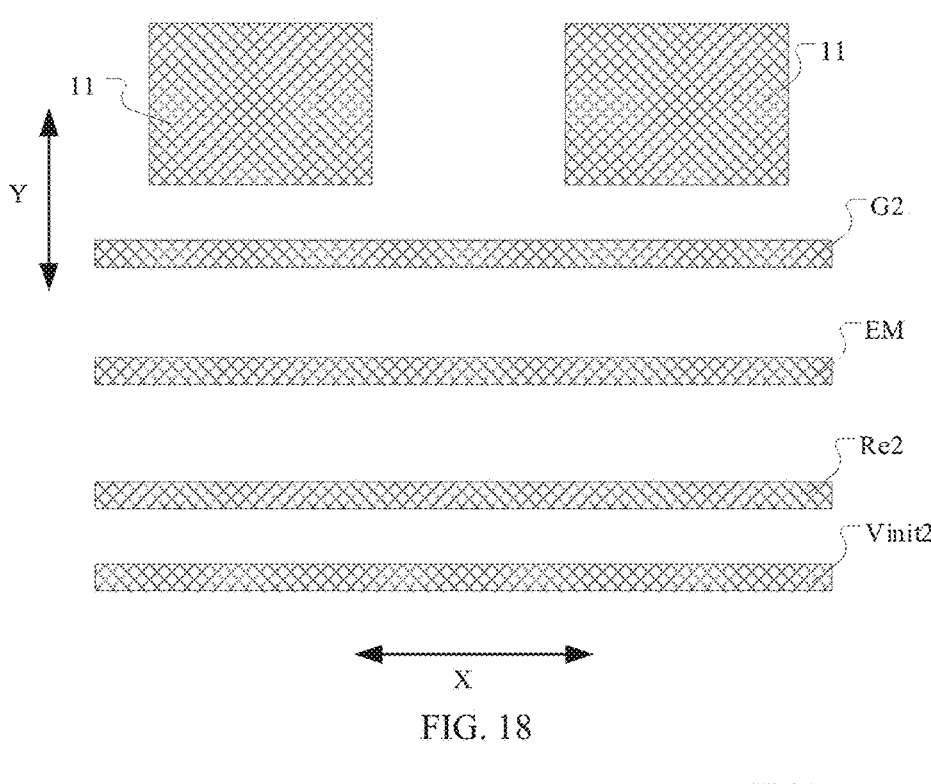
Figure 19:
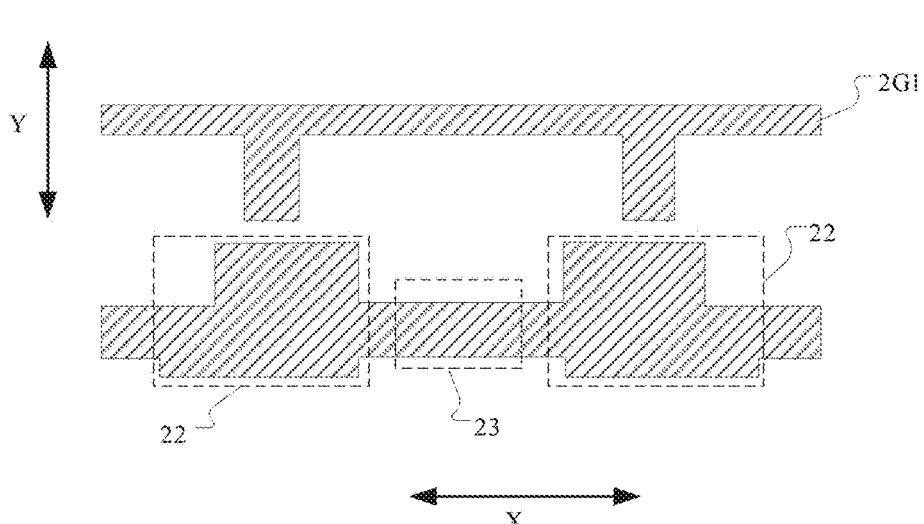
FIG. 19 is a structural layout of a second conductive layer of FIG. 16.
Figure 20:
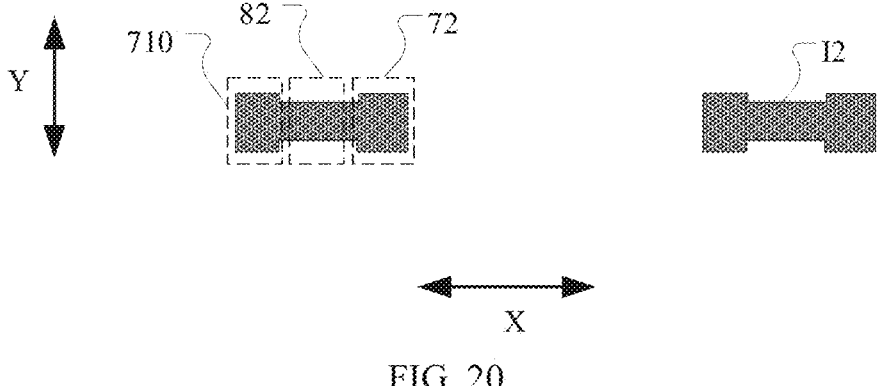
FIG. 20 is a structural layout of a second active layer of FIG. 16.
Figure 21:
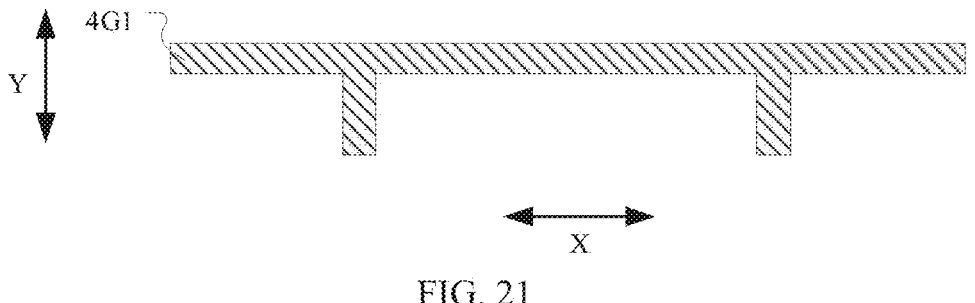
FIG. 21 is a structural layout of a fourth conductive layer of FIG. 16.
Figure 22:
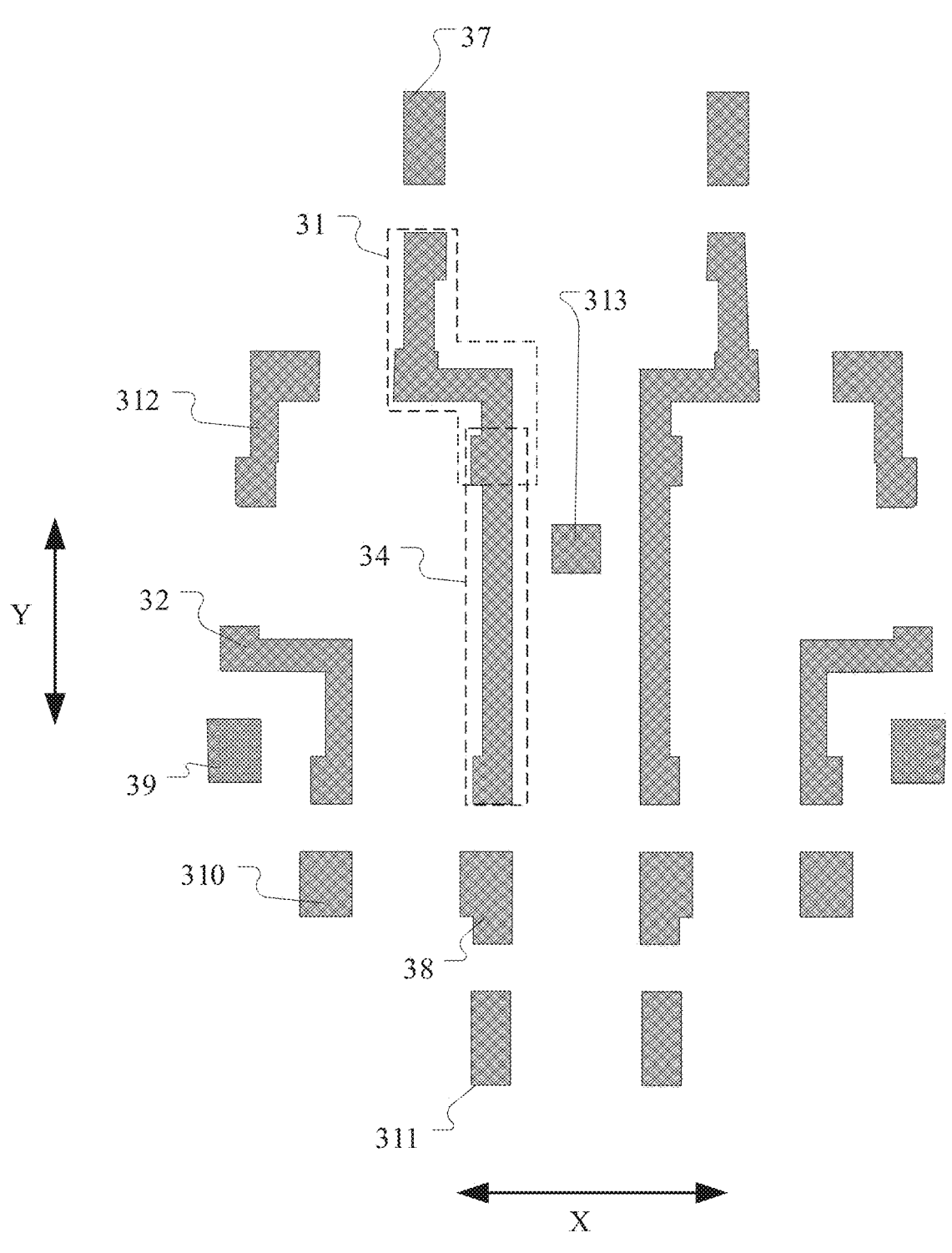
FIG. 22 is a structural layout of a third conductive layer of FIG. 16.
Figure 23:
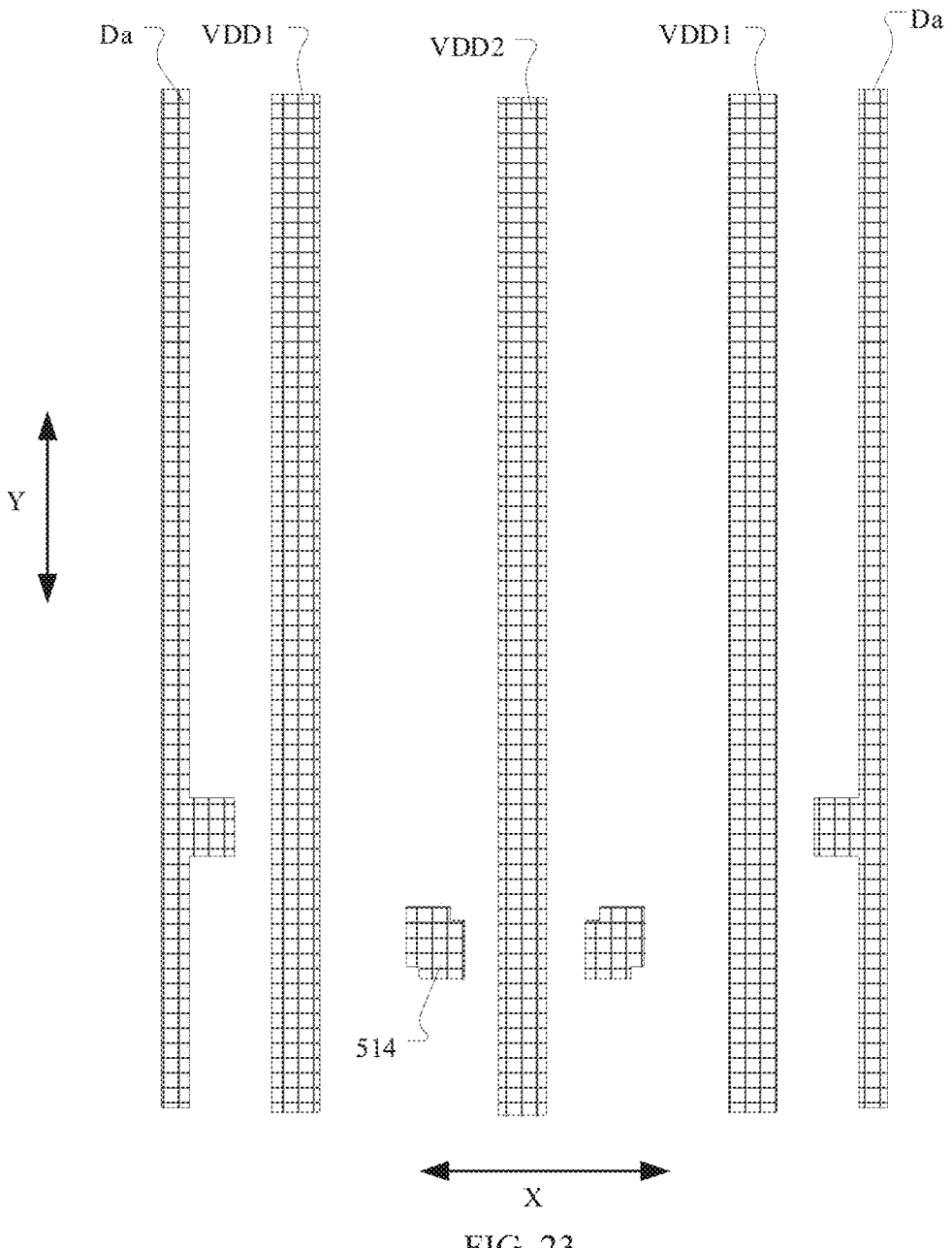
FIG. 23 is a structural layout of a fifth conductive layer of FIG. 16.
Figure 24:
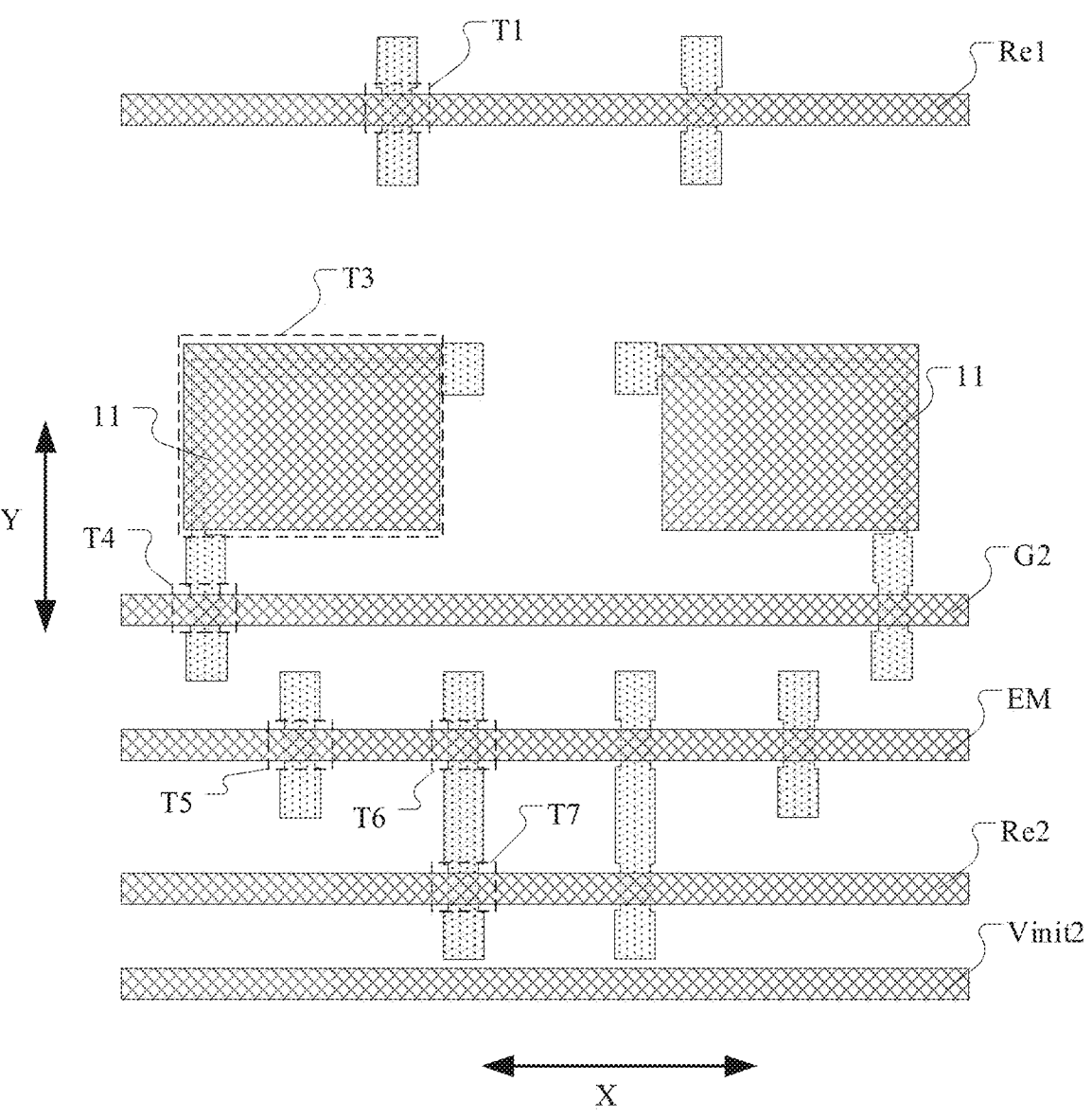
FIG. 24 is a structural layout of the first active layer and the first conductive layer of FIG. 16.
Figure 25:
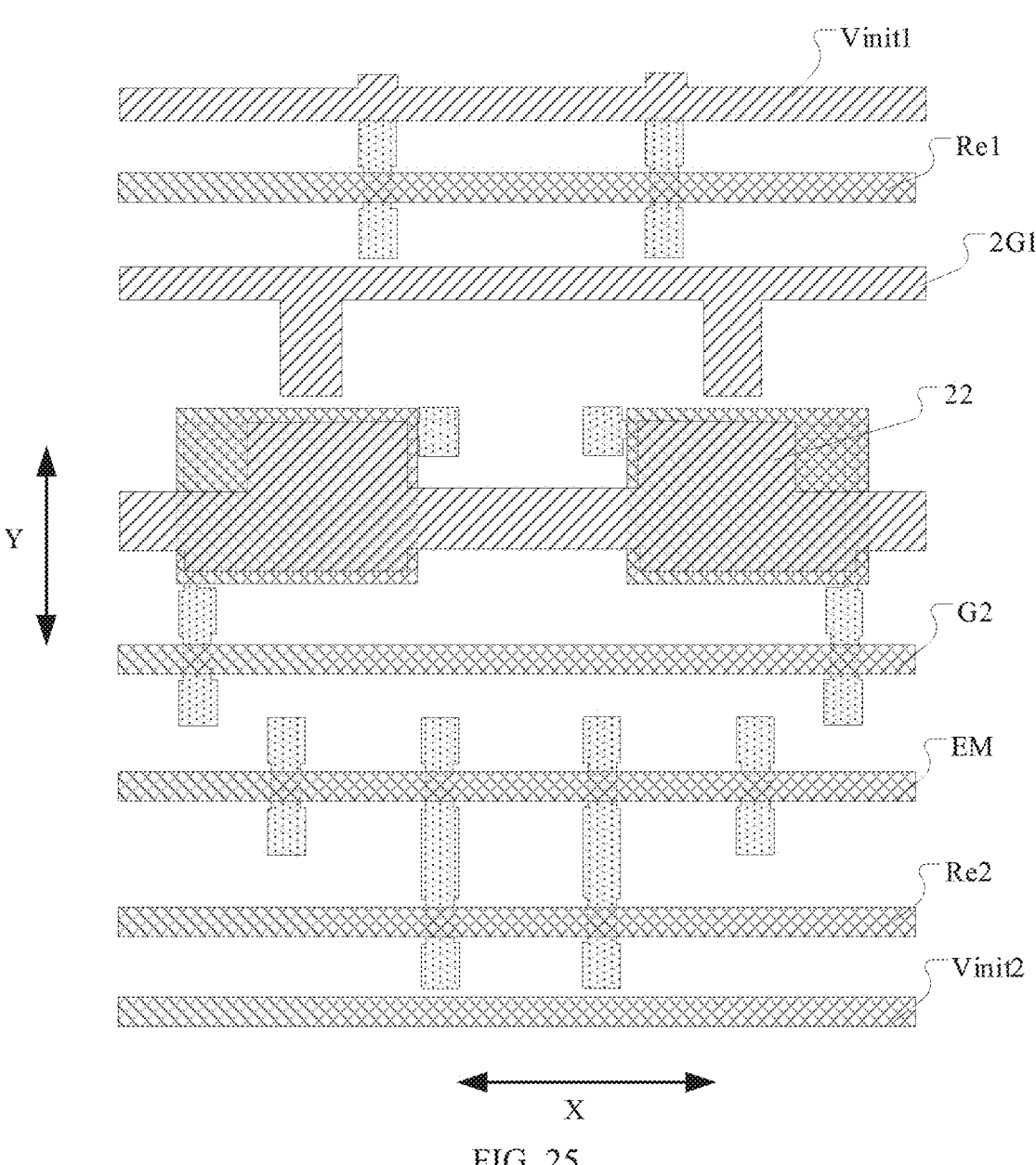
FIG. 25 is a structural layout of the first active layer, the first conductive layer, and the second conductive layer of FIG. 16.
Figure 26:
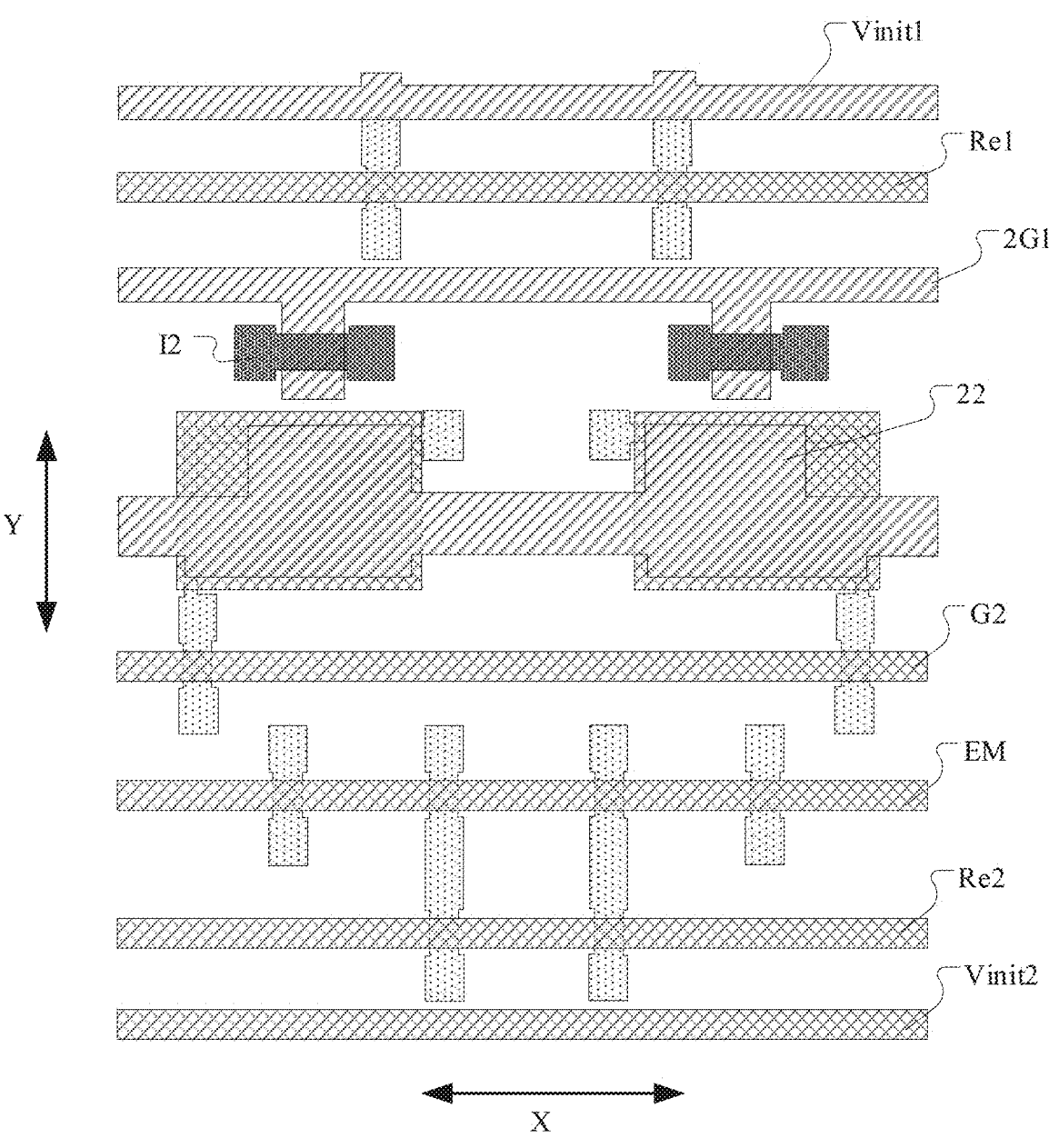
FIG. 26 is a structural layout of the first active layer, the first conductive layer, the second conductive layer, and the second active layer of FIG. 16.
Figure 27:
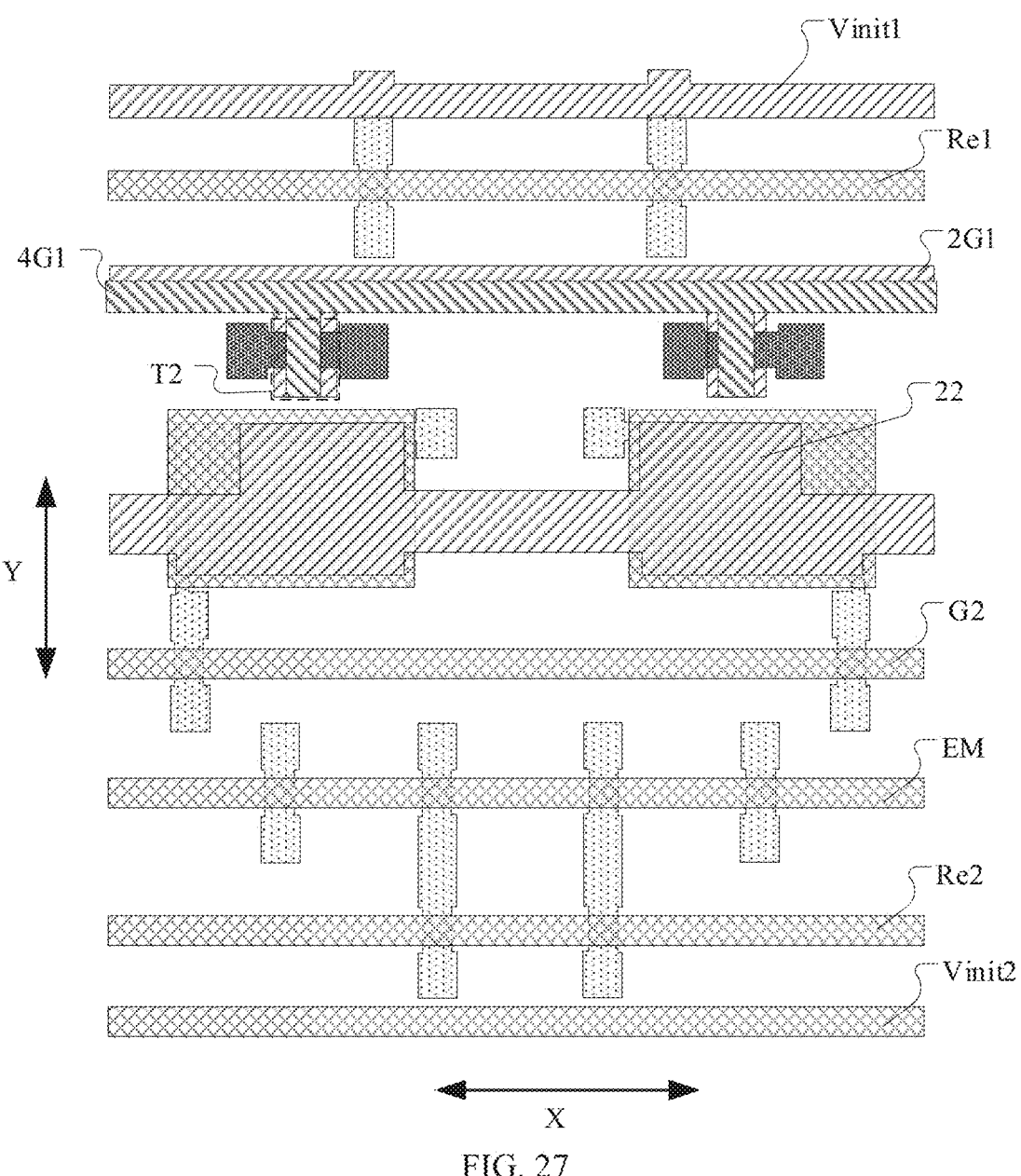
FIG. 27 is a structural layout of the first active layer, the first conductive layer, the second conductive layer, the second active layer, and the fourth conductive layer of FIG. 16.
Figure 28:
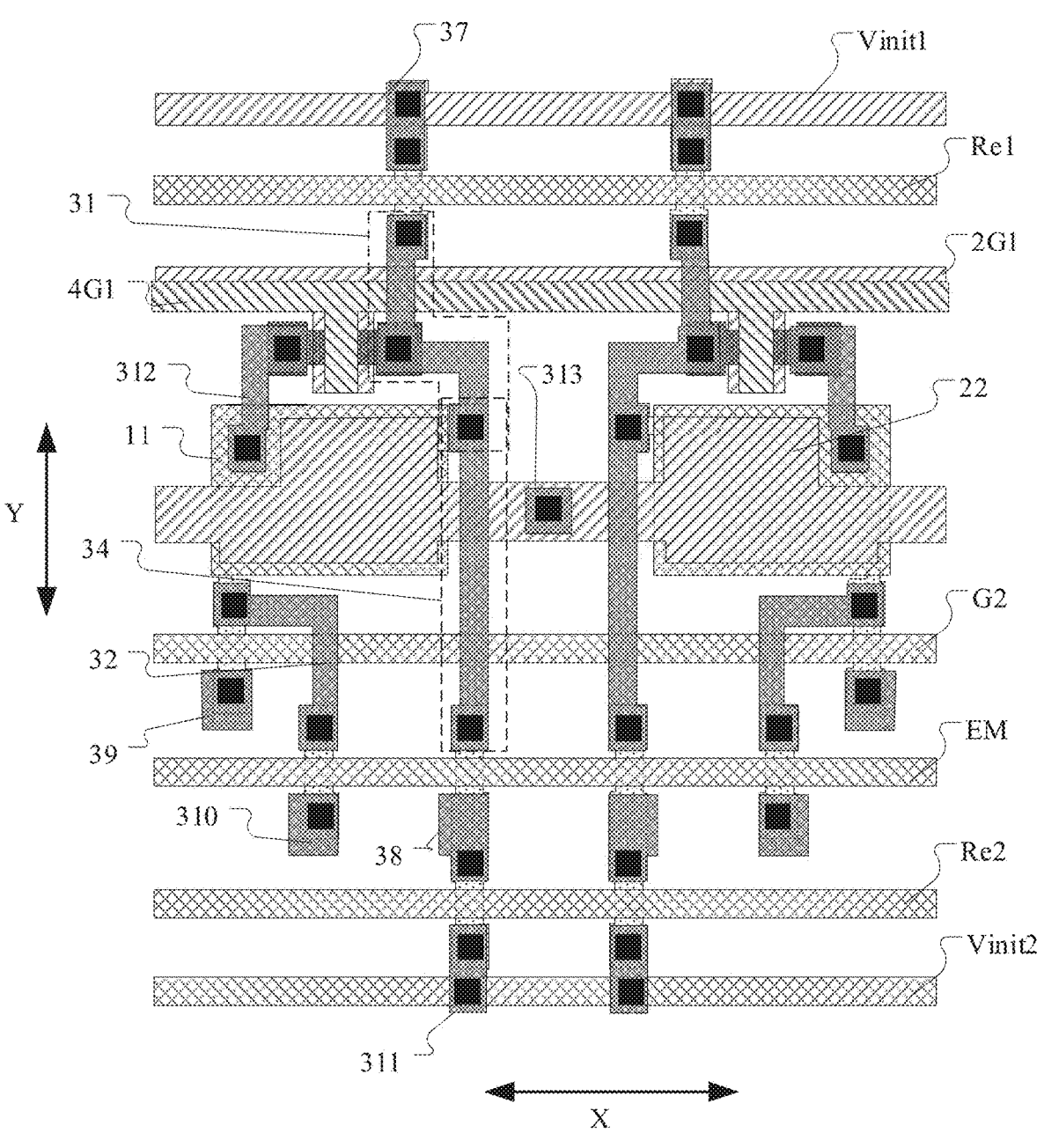
FIG. 28 is a structural layout of the first active layer, the first conductive layer, the second conductive layer, the second active layer, the fourth conductive layer, and the third conductive layer of FIG. 16.

The embodiment further provides another display panel, which may include the pixel driving circuit shown in FIG. 14. The display panel may also include a base substrate, a first active layer, a first conductive layer, a second conductive layer, a second active layer, a fourth conductive layer, a third conductive layer, and a fifth conductive layer that are stacked in sequence, and one or more insulating layers are disposed between the above layers. As shown in FIGS. 16 to 28, FIG. 16 is a structural layout of a display panel according to another embodiment of the present disclosure. FIG. 17 is a structural layout of a first active layer in FIG. 16. FIG. 18 is a structural layout of a first conductive layer in FIG. 16. FIG. 19 is a structural layout of a second conductive layer in FIG. 16. FIG. 20 is a structural layout of a second active layer in FIG. 16. FIG. 21 is a structural layout of a fourth conductive layer in FIG. 16. FIG. 22 is a structural layout of a third conductive layer in FIG. 16. FIG. 23 is a structural layout of a fifth conductive layer in FIG. 16. FIG. 24 is a structural layout of the first active layer and the first conductive layer in FIG. 16. FIG. 25 is a structural layout of the first active layer, the first conductive layer, and the second conductive layer in FIG. 16. FIG. 26 is a structural layout of the first active layer, the first conductive layer, the second conductive layer, and the second active layer in FIG. 16. FIG. 27 is a structural layout of the first active layer, the first conductive layer, the second conductive layer, the second active layer, and the fourth conductive layer in FIG. 16, and FIG. 28 is a structural layout of the first active layer, the first conductive layer, the second conductive layer, the second active layer, the fourth conductive layer, and the third conductive layer in FIG. 16.

Figure 16:
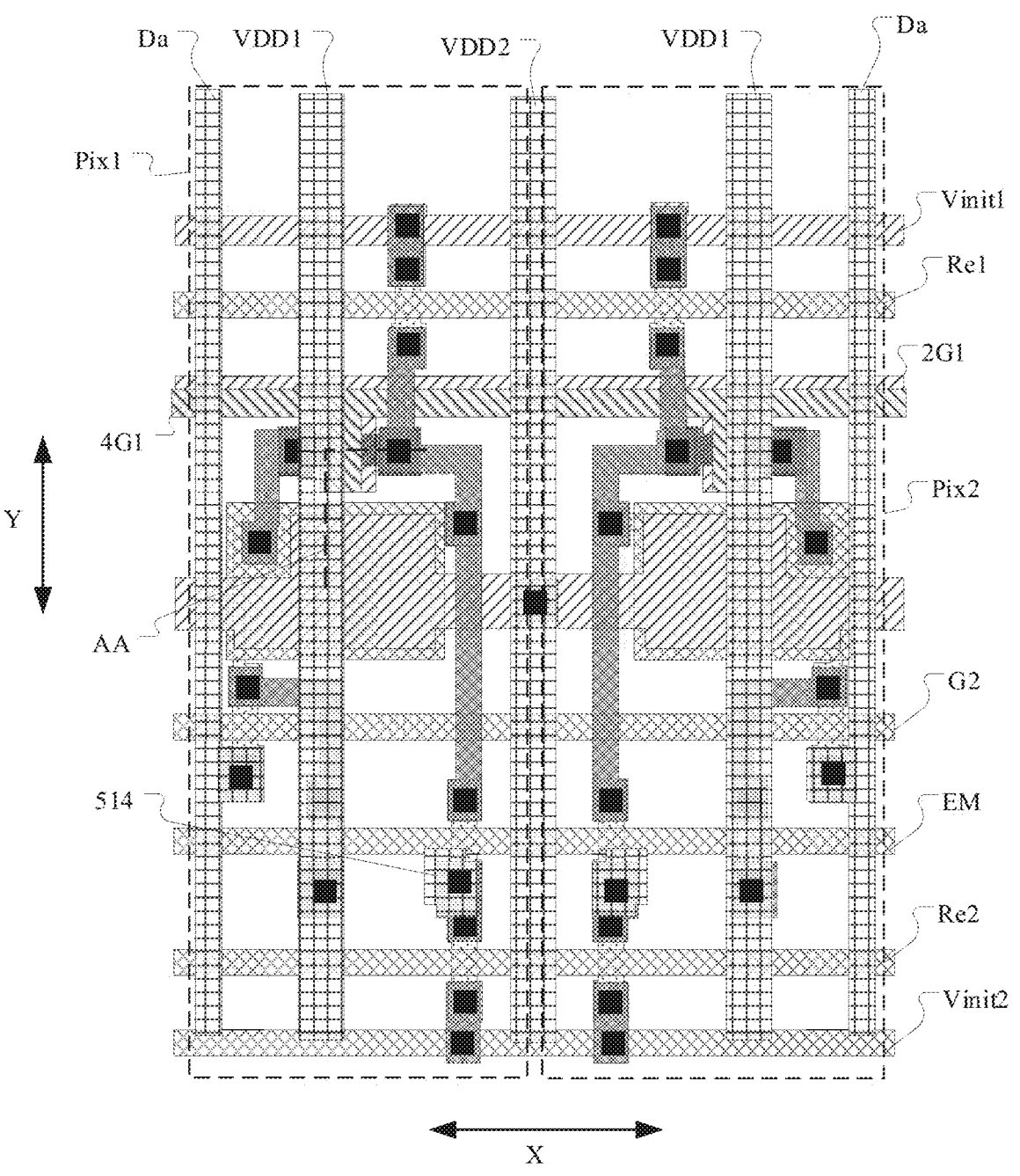
FIG. 16 is a structural layout of a display panel according to another embodiment of the present disclosure.
Figure 17:
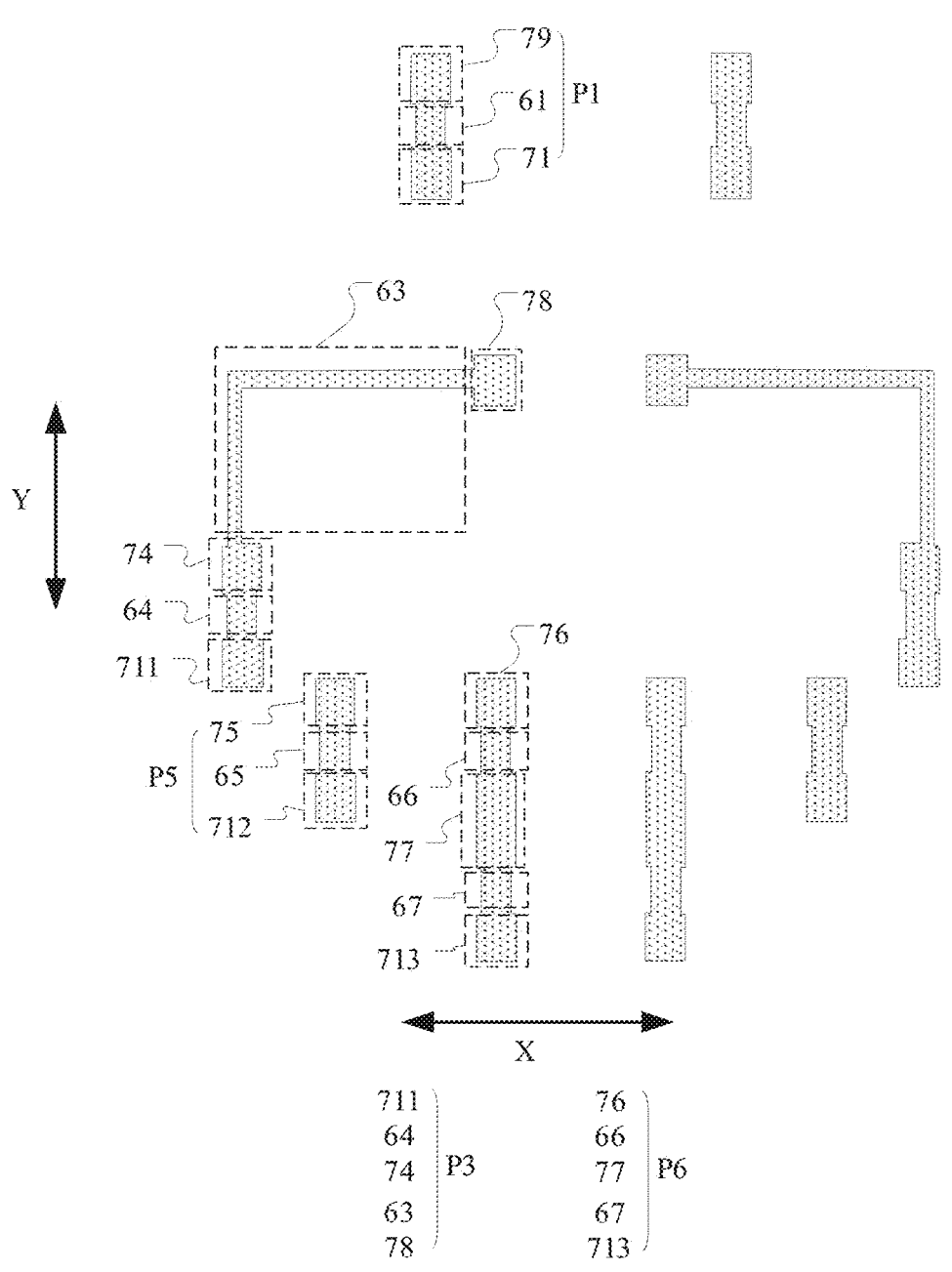
FIG. 17 is a structural layout of a first active layer of FIG. 16.

As shown in FIGS. 16, 17, and 24, the first active layer may include: a first active portion P1, a third active portion P3, a fifth active portion P5, and a sixth active portion P6 that are spaced apart from each other. The first active portion P1 may include a first sub-active portion 61, and a first via-hole connection portion 71 and a ninth via-hole connection portion 79 connected at both ends of the first sub-active portion 61. The third active portion P3 may include a third sub-active portion 63, a fourth sub-active portion 64, a fourth via-hole connection portion 74 connected between the third sub-active portion 63 and the fourth sub-active portion 64, an eighth via-hole connection portion 78 connected to an end of the third sub-active portion 63 away from the fourth via-hole connection portion 74, and an eleventh via-hole connection portion 711 connected to an end of the fourth sub-active portion 64 away from the fourth via-hole connection portion 74. The fifth active portion P5 includes a fifth sub-active portion 65, and a fifth via-hole connection portion 75 and a twelfth via-hole connection portion 712 connected to both ends of the fifth sub-active portion 65. The sixth active portion P6 includes a sixth sub-active portion 66, a seventh sub-active portion 67, a seventh via-hole connection portion 77 connected between the sixth sub-active portion 66 and the seventh sub-active portion 67, a sixth via-hole connection portion 76 connected to an end of the sixth sub-active portion 66 away from the seventh via-hole connection portion 77, and a thirteenth via-hole connection portion 713 connected to an end of the seventh sub-active portion 67 away from the seventh via-hole connection portion 77. The first sub-active portion 61 is used to form the channel region of the first transistor T1, the third sub-active portion 63 is used to form the channel region of the driver transistor T3, the fourth sub-active portion 64 is used to form the channel region of the fourth transistor T4, the fifth sub-active portion 65 is used to form the channel region of the fifth transistor T5, the sixth sub-active portion 66 is used to form the channel region of the sixth transistor T6, and the seventh sub-active portion 67 is used to form the channel region of the seventh transistor T7. The first active layer may be formed from a polysilicon material, and accordingly, the first transistor T1, the driver transistor T3, the fourth transistor T4, the fifth transistor T5, the sixth transistor T6, and the seventh transistor T7 may be P-type low-temperature polycrystalline silicon thin-film transistors.

As shown in FIGS. 16, 18, and 24, the first conductive layer may include a first reset signal line Re1, a second gate line G2, an enabling signal line EM, a second reset signal line Re2, a second initial signal line Vinit2, and a first conductive portion 11. An orthographic projection of the first reset signal line Re1 on the base substrate, an orthographic projection of the second gate line G2 on the base substrate, an orthographic projection of the enabling signal line EM on the base substrate, and an orthographic projection of the second reset signal line Re2 on the base substrate, and an orthographic projection of the second initial signal line Vinit2 on the base substrate may all extend along a first direction X. The orthographic projection of the first reset signal line Re1 on the base substrate covers an orthographic projection of the first sub-active portion 61 on the base substrate, a portion of the structure of the first reset signal line Re1 is used to form the gate of the first transistor T1, and the first reset signal line Re1 is used to provide a first reset signal terminal. The orthographic projection of the second gate line G2 on the base substrate covers an orthographic projection of the fourth sub-active portion 64 on the base substrate, a portion of the structure of the second gate line G2 is used to form the gate of the fourth transistor T4, and the second gate line G2 is used to provide a second gate drive signal terminal. The orthographic projection of the enabling signal line EM on the base substrate covers an orthographic projection of the sixth sub-active portion 66 on the base substrate, and an orthographic projection of the fifth sub-active portion 65 on the base substrate, a portion of the structure of the enabling signal line EM is used to form the gates of the fifth transistor T5 and the sixth transistor T6, and the enabling signal line EM is used to provide an enabling signal terminal. The orthographic projection of the second reset signal line Re2 on the base substrate covers an orthographic projection of the seventh sub-active portion 67 on the base substrate, a portion of the structure of the second reset signal line Re2 is used to form the gate of the seventh transistor T7, and the second reset signal line Re2 is used to provide a second reset signal terminal. The second initial signal line Vinit2 is used to provide a second initial signal terminal. An orthographic projection of the first conductive portion 11 on the base substrate covers an orthographic projection of the third sub-active portion 63 on the base substrate, and the first conductive portion 11 is used to form the gate of the driver transistor T3, and furthermore, the first conductive portion 11 may be reused as the second electrode of the capacitor C. The display panel may use the first conductive layer as a mask to perform conductive processing on the first active layer, i.e., a region of the first active layer covered by the first conductive layer may form a channel region of a transistor, and a region of the first active layer not covered by the first conductive layer forms a via-hole connection portion.

As shown in FIGS. 16, 19, and 25, the second conductive layer may include a first initial signal line Vinit1, a third gate line 2G1, and second conductive portions 22. An orthographic projection of the first initial signal line Vinit1 on the base substrate, and an orthographic projection of the third gate line 2G1 on the base substrate extend in the first direction X. The first initial signal line Vinit1 is used to provide a first initial signal terminal. The third gate line 2G1 may be used to provide a first gate drive signal terminal. An orthographic projection of the second conductive portion 22 on the base substrate and the orthographic projection of the first conductive portion 11 on the base substrate at least partially overlap, and the second conductive portion 22 is used to form the first electrode of the capacitor C.

As shown in FIGS. 16, 20, and 26, the second active layer may include a second active portion 12. The second active portion 12 may include a second sub-active portion 82, and a second via-hole connection portion 72 and a tenth via-hole connection portion 710 connected to both ends of the second sub-active portion 82. The second sub-active portion 82 is used to form a channel region of the second transistor T2. The second active layer may be formed from indium gallium zinc oxide, and accordingly, the second transistor T2 may be an N-type metal oxide thin film transistor. The orthographic projection of the third gate line 2G1 on the base substrate may cover an orthographic projection of the second sub-active portion 82 on the base substrate, and a portion of the structure of the third gate line 2G1 may be used to form a bottom gate of the second transistor T2.

As shown in FIGS. 16, 21, and 27, the fourth conductive layer may include a first gate line 4G1. An orthographic projection of the first gate line 4G1 on the base substrate may extend along the first direction X, and the orthographic projection of the first gate line 4G1 on the base substrate may cover the orthographic projection of the second sub-active portion 82 on the base substrate, and a portion of the structure of the first gate line 4G1 may be used to form a top gate of the second transistor T2. The first gate line 4G1 may be connected to the third gate line 2G1 through a via hole in a tracing area at the edge of the display panel, and the first gate line 4G1 may be used together with the third gate line 2G1 to provide the first gate drive signal terminal. The display panel may use the fourth conductive layer as a mask to perform conductive processing on the second active layer, i.e., a region of the second active layer covered by the fourth conductive layer may form a channel region of a transistor, and a region of the second active layer not covered by the fourth conductive layer forms an over-hole connection portion.

As shown in FIGS. 16, 22, and 28, the third conductive layer may include: a first bridge portion 31, a second bridge portion 32, a fourth bridge portion 34, a seventh bridge portion 37, an eighth bridge portion 38, a ninth bridge portion 39, a tenth bridge portion 310, an eleventh bridge portion 311, a twelfth bridge portion 312, and a thirteenth bridge portion 313. The first bridge portion 31 is connected to the first via-hole connection portion 71, the second via-hole connection portion 72, and the eighth via-hole connection portion 78 through via holes H, respectively, in order to connect the first electrode of the driver transistor T3, the second electrode of the first transistor T1, and the second electrode of the second transistor T2. The black square indicates the position of the via hole. An orthographic projection of the first bridge portion 31 on the base substrate extends along a second direction Y. The second direction Y may intersect the first direction X. For example, the second direction may be a column direction and the first direction X may be a row direction. The orthographic projection of the first bridge portion 31 on the base substrate is located on a side of the orthographic projection of the first reset signal line Re1 on the base substrate facing the orthographic projection of the first conductive portion 11 on the base substrate, and the orthographic projection of the first bridge portion 31 on the base substrate intersects with the orthographic projection of the first gate line 4G1 on the base substrate. The second bridge portion 32 is connected to the fourth via-hole connection portion 74 and the fifth via-hole connection portion 75 through via holes, respectively, in order to connect the second electrode of the fifth transistor T5, the second electrode of the driver transistor T3, and the second electrode of the fourth transistor T4. The orthographic projection of the second bridge portion 32 on the base substrate is located between the orthographic projection of the enabling signal line EM on the base substrate and the orthographic projection of the first conductive portion 11 on the base substrate. The fourth bridge portion 34 may be connected to the eighth via-hole connection portion 78 and the sixth via-hole connection portion 76 through via holes, respectively, in order to connect the first electrode of the sixth transistor T6 and the first electrode of the driver transistor T3. The fourth bridge portion 34 and the first bridge portion 31 share a portion of the conductive portion and use the shared portion of the conductive portion to connect the eighth via-hole connection portion 78 through the same via hole. The orthographic projection of the fourth bridge portion 34 on the base substrate extends along the second direction Y and is located between the orthographic projection of the enabling signal line EM on the base substrate and the orthographic projection of the first gate line G1 on the base substrate. The seventh bridge portion 37 may be connected to the first initial signal line Vinit1 and the ninth via-hole connection portion 79 through via holes, respectively, in order to connect the first electrode of the first transistor T1 and the first initial signal terminal. The eighth bridge portion 38 may be connected to the seventh via-hole connection portion 77 through a via hole, in order to connect the second electrode of the sixth transistor T6 and the second electrode of the seventh transistor T7. The ninth bridge portion 39 may be connected to the eleventh via-hole connection portion 711 through a via hole, in order to connect the first electrode of the fourth transistor T4. The tenth bridge portion 310 may be connected to the twelfth via-hole connection portion 712 through a via hole, in order to connect the first electrode of the fifth transistor T5. The eleventh bridge portion 311 may be connected to the thirteenth via-hole connection portion 713 and the second initial signal line Vinit2 through via holes, respectively, in order to connect the first electrode of the seventh transistor T7 and the second initial signal terminal. The twelfth bridge portion 312 may be connected to the first conductive portion 11 and the tenth via-hole connection portion 710 through via holes, respectively, in order to connect the first electrode of the second transistor T2 and the gate of the driver transistor T3.

As shown in FIG. 19, the second conductive layer may also include a connection portion 23. The second conductive portions 22 adjacent to each other in the first direction X may be connected by the connection portion 23. As shown in FIG. 16, FIG. 16 illustrates a minimum repeating unit in the display panel, which may include a first pixel driving circuit Pix1 and a second pixel driving circuit Pix2. The first pixel driving circuit Pix1 and the second pixel driving circuit Pix2 may be mirrored. The thirteenth bridge portion 313 may be provided in one-to-one correspondence with the minimum repeating unit, and the thirteenth bridge portion 313 may be connected to the connection portion 23 in the minimum repeating unit corresponding thereto through a via hole.

In this embodiment, the sheet resistance of the third conductive layer is less than the sheet resistance of the over-hole connection portion in the first active layer. In this embodiment, the first transistor T1 and the driver transistor T3 are connected through the first bridge portion 31, the driver transistor T3 and the sixth transistor T6 are connected through the fourth bridge portion 34, and the fourth transistor T4 and the fifth transistor T5 are connected through the second bridge portion 32. This arrangement can also improve the display panel's mura problem (i.e., uneven display brightness) and sandy mura problem (i.e., uneven brightness brought by the graininess).

As shown in FIGS. 16 and 23, the fifth conductive layer may include a data line Da, a first power line VDD1, a second power line VDD2, and a fourteenth bridge portion 514. An orthographic projection of the data line Da on the base substrate, an orthographic projection of the first power line VDD1 on the base substrate, and an orthographic projection of the second power line VDD2 on the base substrate may all extend in the second direction Y. The data line Da is used to provide a data signal terminal, and the data line Da may be connected to the ninth bridge portion 39 through a via hole, in order to connect the first electrode of the fourth transistor T4 and the data signal terminal. The first power line VDD1 may be used to provide a first power supply terminal, and the first power line VDD1 may be connected to the tenth bridge portion 310 through a via hole, in order to connect the first electrode of the fifth transistor T5 and the first power supply terminal. The second power line VDD2 may be connected to the thirteenth bridge portion 313 through a via hole, in order to connect the first electrode of the capacitor C and the first power supply terminal. The second conductive portions 22 connected in the first direction X may form a grid structure with the second power supply line VDD2, which has a low resistance, thereby improving the problem of uneven display of the display panel due to the voltage drop of the power line. In addition, the second power line VDD2 may shield interference information in the two pixel driving circuits in the minimum repeating unit. The first power line VDD1 may be connected to the second power line VDD2 in a display area of the display panel or an edge tracing area at an edge of the display area. The fourteenth bridge portion 514 may be connected to the eighth bridge portion 38 through a via hole to connect the second electrode of the sixth transistor T6, and the fourteenth bridge portion 514 may be used to connect the light emitting unit.

It should be noted that, as shown in FIGS. 16 and 28, the black square drawn on the side of the fifth conductive layer facing away from the base substrate indicates the via hole of the fifth conductive layer connecting to other layers on the side of the fifth conductive layer facing the base substrate; and the black square drawn on the side of the third conductive layer facing away from the base substrate indicates the via hole of the third conductive layer connecting to other layers on the side of the third conductive layer facing the base substrate. The black square indicates only the position of the via hole, and the different via holes indicated by the black squares at different positions may penetrate through different insulating layers.

Figure 29:
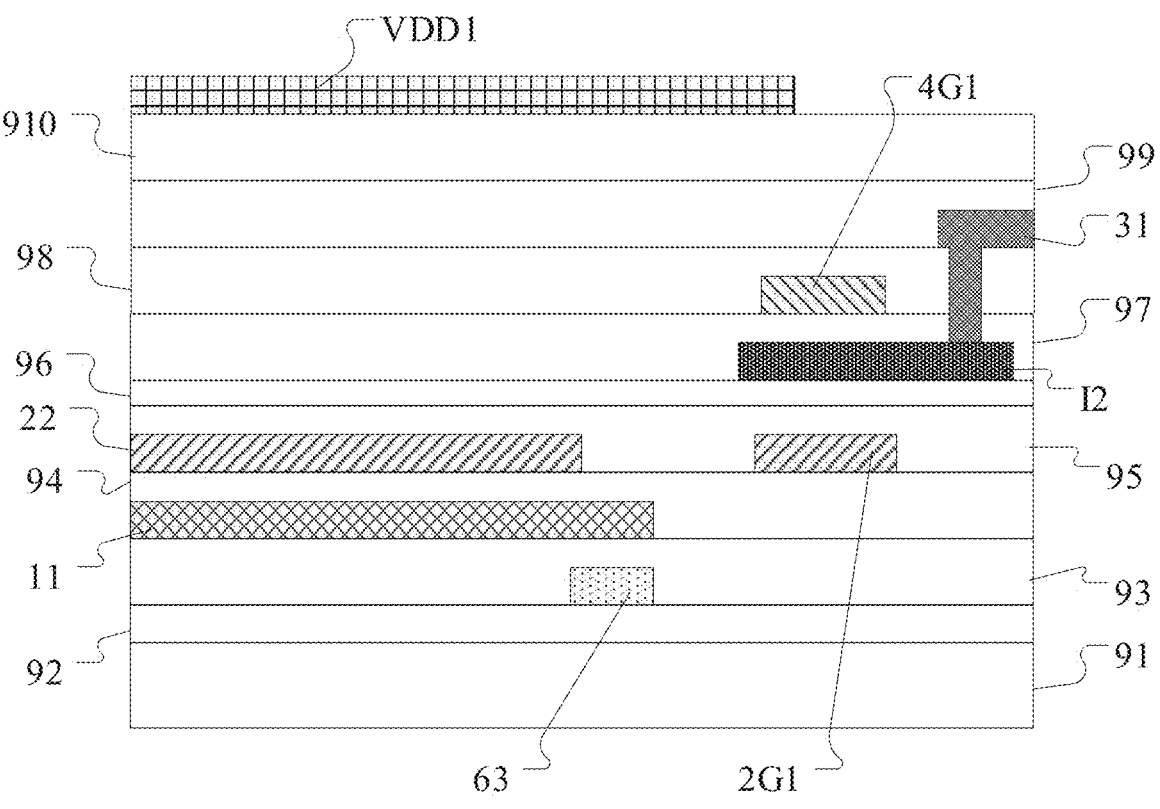
FIG. 29 is a partial cross-sectional view of the display panel shown in FIG. 16 along dashed line AA.

As shown in FIG. 29, it is a partial cross-sectional view of the display panel shown in FIG. 16 along the dashed line AA. The display panel may further include a first buffer layer 92, a first insulating layer 93, a second insulating layer 94, a first dielectric layer 95, a second buffer layer 96, a third insulating layer 97, a second dielectric layer 98, a passivation layer 99, and a first flat layer 910. The base substrate 91, the first buffer layer 92, the first active layer, the first insulating layer 93, the first conductive layer, the second insulating layer 94, the second conductive layer, the first dielectric layer 95, the second buffer layer 96, the second active layer, the third insulating layer 97, the third conductive layer, the second dielectric layer 98, the fourth conductive layer, the passivation layer 99, the first flat layer 910, and the fifth conductive layer are stacked in sequence. The first insulating layer 93, the second insulating layer 94, or the third insulating layer 97 may be a single-layer structure or a multi-layer structure. The material of the first insulating layer 93, the second insulating layer 94, and the third insulating layer 97 may be at least one of silicon nitride, silicon oxide, and silicon nitride oxide. The first buffer layer 92, the second buffer layer 96, the first dielectric layer 95, and the second dielectric layer 98 may be silicon nitride layers. The material of the first flat layer 910 may be an organic material, such as polyimide (PI), polyethylene terephthalate (PET), polyethylene naphthalate (PEN), silicone-glass bonding structure (SOG), and other materials. The base substrate 91 may include a glass substrate, a barrier layer, and a polyimide layer that are stacked in sequence, wherein the barrier layer may be made of an inorganic material. The material of the first conductive layer, the second conductive layer, and the fourth conductive layer may be one of molybdenum, aluminum, copper, titanium, and niobium, or may be an alloy, or may be a molybdenum-titanium alloy, or may be a stacked layer of molybdenum and titanium, etc. The material of the third conductive layer and the fifth conductive layer may include a metallic material, for example, may be one of molybdenum, aluminum, copper, titanium, and niobium, or may be an alloy, or may be a molybdenum-titanium alloy or a stacked layer of molybdenum and titanium, etc., or may be a stacked layer of titanium, aluminum, and titanium (i.e., titanium/aluminum/titanium). In addition, the display panel may also include an electrode layer, and a pixel definition layer, and the like disposed on a side of the fifth conductive layer facing away from the base substrate.

It should be noted that the scale of the accompanying drawings in the present disclosure can be used as a reference in the actual process, but is not limited thereto, for example, the width-to-length ratio of the channel, the thickness and spacing of each film layer, and the width and spacing of each signal line can be adjusted according to the actual needs. The number of pixels in the display substrate and the number of sub-pixels in each pixel are also not limited to the number shown in the drawings. The accompanying drawings depicted in the present disclosure are only schematic diagrams of the structure. In addition, the qualifiers such as first, second, etc. are only used to qualify the names of different structures, which do not have a specific order of meaning.

The embodiments of the present disclosure further provide a display device including the display panel as described above. The display device may be a display device such as a cell phone, a tablet computer, a television, and the like.

Other embodiments of the present disclosure will readily apparent to those skilled in the art upon consideration of the specification and practice of the disclosure herein. The present application is intended to cover any variations, uses, or adaptations of the present disclosure that follow the general principles of the present disclosure and include common knowledge or customary technical means in the art not disclosed herein. The specification and embodiments are to be regarded as exemplary only, and the true scope and spirit of the present disclosure is indicated by the claims.

It should be understood that the present disclosure is not limited to the precise structure that has been described above and illustrated in the accompanying drawings, and that various modifications and changes may be made without departing from its scope. The scope of the present disclosure is limited only by the appended claims.

What is claimed is:

1. A display panel, comprising a plurality of pixel driving circuits each comprising two or more transistors, and further comprising:

a base substrate;

a first active layer on a side of the base substrate, the first active layer comprising a plurality of active portions in a single pixel driving circuit, wherein the plurality of active portions in the single pixel driving circuit are spaced apart from each other, each active portion of the plurality of active portions comprises a sub-active portion and a via-hole connection portion connected to each other, and the sub-active portion is disposed corresponding to a transistor of the two or more transistors in the single pixel driving circuit, and configured to form a channel region of the corresponding transistor; and a third conductive layer on a side, away from the base substrate, of the first active layer, the third conductive layer comprising at least one bridge portion, wherein the at least one bridge portion is connected to via-hole connection portions in different active portions in the single pixel driving circuit through via holes to electrically connect channel regions of different transistors in the single pixel driving circuit to each other, respectively;

wherein a sheet resistance of the third conductive layer is less than a sheet resistance of the via hole connection portion, wherein the two or more transistors in the single pixel comprises a driver transistor and a fifth transistor, and a first electrode of the fifth transistor is connected to a power line and a second electrode of the fifth transistor is connected to a second electrode of the drive transistor, wherein the plurality of active portions comprise:

a third active portion comprising a third sub-active portion and a third via-hole connection portion connected to each other, wherein the third sub-active portion is configured to form a channel region of the drive transistor, and the third via-hole connection portion is configured to form the via-hole connection portion; and a fifth active portion comprising a fifth sub-active portion and a fifth via-hole connection portion connected to each other, wherein the fifth sub-active portion is configured to form a channel region of the fifth transistor, and the fifth via-hole connection portion is configured to form the via-hole connection portion, wherein the at least one bridge portion comprises:

a third bridge portion being connected to the third via-hole connection portion and the fifth connection portion through via holes, respectively, so that the second electrode of the fifth transistor is electrically connected to the second electrode of the driver transistor, wherein the third active portion is separated and disconnected from the fifth active portion in the first active layer.

2. The display panel of claim 1, wherein the two or more transistors further comprise: a first transistor, and a second transistor; wherein a first electrode of the first transistor is connected to a first initial signal line, and a second electrode of the first transistor is connected to a gate of the driver transistor; and a first electrode of the second transistor is connected to the gate of the driver transistor, and a second electrode of the second transistor is connected to a first electrode of the driver transistor; and wherein the plurality of active portions further comprise:

a first active portion comprising a first sub-active portion and a first via-hole connection portion connected to each other, wherein the first sub-active portion is configured to form a channel region of the first transistor, and the first via-hole connection portion is configured to form the via-hole connection portion; and a second active portion comprising a second sub-active portion and a second via-hole connection portion connected to each other, wherein the second sub-active portion is configured to form a channel region of the second transistor, and the second via-hole connection portion is configured to form the via-hole connection portion; and wherein the at least one bridge portion further comprises:

a first bridge portion being connected to the first via-hole connection portion and the second via-hole connection portion through via holes, respectively.

3. The display panel of claim 1, wherein the two or more transistors further comprise: a fourth transistor; wherein a first electrode of the fourth transistor is connected to a data line and a second electrode of the fourth transistor is connected to the second electrode of the driver transistor;

wherein the plurality of active portions further comprise:

a fourth active portion comprising a fourth sub-active portion and a fourth via-hole connection portion connected to each other, wherein the fourth sub-active portion is configured to form a channel region of the fourth transistor, and the fourth via-hole connection portion is configured to form the via-hole connection portion; and wherein the at least one bridge portion further comprises:

a second bridge portion being connected to the third via-hole connection portion and the fourth connection portion through via holes, respectively.

4. The display panel of claim 1, wherein the single pixel driving circuit is configured to drive a light emitting unit to emit light, and the two or more transistors further comprise: a sixth transistor; wherein a first electrode of the sixth transistor is connected to a first electrode of the driver transistor, and a second electrode of the sixth transistor is connected to a first electrode of the light emitting unit;

wherein the third active portion further comprises an eighth via-hole connection portion connected to the third sub-active portion, the eighth via-hole connection portion is configured to form the via-hole connection portion, and the plurality of active portions further comprise:

a sixth active portion comprising a sixth sub-active portion and a sixth via-hole connection portion connected to each other, wherein the sixth sub-active portion is configured to form a channel region of the sixth transistor, and the sixth via-hole connection portion is configured to form the via-hole connection portion; and wherein the at least one bridge portion further comprises:

a fourth bridge portion being connected to the eighth via-hole connection portion and the sixth connection portion through via holes, respectively.

5. The display panel of claim 1, wherein the single pixel driving circuit is configured to drive a light emitting unit to emit light, and the two or more transistors further comprise: a sixth transistor, and a seventh transistor; wherein a first electrode of the sixth transistor is connected to a first electrode of the driver transistor, and a second electrode of the sixth transistor is connected to a first electrode of the light emitting unit; and a first electrode of the seventh transistor is connected to a second initial signal line, and a second electrode of the seventh transistor is connected to the first electrode of the light emitting unit;

wherein the plurality of active portions further comprise:

a sixth active portion comprising a sixth sub-active portion and a ninth via-hole connection portion connected to each other, wherein the sixth sub-active portion is configured to form a channel region of the sixth transistor, and the ninth via-hole connection portion is configured to form the via-hole connection portion; and a seventh active portion comprising a seventh sub-active portion and a seventh via-hole connection portion connected to each other, wherein the seventh sub-active portion is configured to form a channel region of the seventh transistor, and the seventh via-hole connection portion is configured to form the via-hole connection portion; and wherein the at least one bridge portion further comprises:

a fifth bridge portion being connected to the ninth via-hole connection portion and the seventh connection portion through via holes, respectively.

6. The display panel of claim 1, wherein the two or more transistors further comprise: a second transistor; wherein a first electrode of the second transistor is connected to a gate of the driver transistor and a second electrode of the second transistor is connected to a first electrode of the driver transistor;

wherein the third active portion further comprises an eighth via-hole connection portion connected to the third sub-active portion, the eighth via-hole connection portion is configured to form the via-hole connection portion, and the plurality of active portions further comprise:

a second active portion comprising a second sub-active portion and a tenth via-hole connection portion connected to each other, wherein the second sub-active portion is configured to form a channel region of the second transistor, and the tenth via-hole connection portion is configured to form the via-hole connection portion; and wherein the at least one bridge portion further comprises:

a sixth bridge portion being connected to the tenth via-hole connection portion and the eighth connection portion through via holes, respectively.

7. The display panel of claim 1, wherein the two or more transistors further comprise: a first transistor, and a second transistor; wherein a first electrode of the first transistor is connected to a first initial signal line, and a second electrode of the first transistor is connected to a gate of the driver transistor; and a first electrode of the second transistor is connected to the gate of the driver transistor, and a second electrode of the second transistor is connected to a first electrode of the driver transistor;

wherein the plurality of active portions further comprise:

a first active portion comprising a first sub-active portion and a first via-hole connection portion connected to each other, wherein the first sub-active portion is configured to form a channel region of the first transistor, and the first via-hole connection portion is configured to form the via-hole connection portion, wherein the third active portion further comprises a second sub-active portion and a second via-hole connection portion connected to a side of the second sub-active portion away from the third sub-active portion;

wherein the display panel further comprises a first conductive layer between the first active layer and the third conductive layer, the first conductive layer comprising:

a first reset signal line, wherein an orthographic projection of the first reset signal line on the base substrate extends in a first direction and covers an orthographic projection of the first sub-active portion on the base substrate, and a portion of the first reset signal line is configured to form a gate of the first transistor;

a first gate line, wherein an orthographic projection of the first gate line on the base substrate extends in the first direction and covers an orthographic projection of the second sub-active portion on the base substrate, and a portion of the first gate line is configured to form a gate of the second transistor;

a first conductive portion, wherein an orthographic projection of the first conductive portion on the base substrate covers an orthographic projection of the third sub-active portion on the base substrate, and the first conductive portion is configured to form the gate of the driver transistor;

wherein the orthographic projection of the first reset signal line on the base substrate is on a side, away from the orthographic projection of the first conductive portion on the base substrate, of the orthographic projection of the first gate line on the base substrate; and wherein the at least one bridge portion further comprises:

a first bridge portion being connected to the first via-hole connection portion and the second via-hole connection portion through via holes, respectively, wherein an orthographic projection of the first bridge portion on the base substrate extends in the first direction, and is between the orthographic projection of the first reset signal line on the base substrate and the orthographic projection of the first gate line on the base substrate.

8. The display panel of claim 3, wherein the two or more transistors further comprise a second transistor; wherein a first electrode of the second transistor is connected to a gate of the driver transistor, a second electrode of the second transistor is connected to a first electrode of the driver transistor, and a gate of the second transistor is connected to a first gate line;

wherein the display panel further comprises a first conductive layer between the first active layer and the third conductive layer, the first conductive layer comprising:

a first conductive portion, wherein an orthographic projection of the first conductive portion on the base substrate covers an orthographic projection of the third sub-active portion on the base substrate, and the first conductive portion is configured to form the gate of the driver transistor;

the first gate line, wherein an orthographic projection of the first gate line on the base substrate extends in a first direction;

a second gate line, wherein an orthographic projection of the second gate line on the base substrate extends in the first direction, and covers an orthographic projection of the fourth sub-active portion on the base substrate, and a portion of the second gate line is configured to form a gate of the fourth transistor; and wherein the orthographic projection of the second gate line on the base substrate is on a side, away from the orthographic projection of the first gate line on the base substrate, of the orthographic projection of the first conductive portion on the base substrate; and an orthographic projection of the second bridge portion on the base substrate extends in the first direction, and is between the orthographic projection of the first conductive portion on the base substrate and the orthographic projection of the second gate line on the base substrate.

9. The display panel of claim 8, wherein the first conductive layer further comprises:

a first enabling signal line, wherein an orthographic projection of the first enabling signal line on the base substrate extends in the first direction, and covers an orthographic projection of the fifth sub-active portion on the base substrate, and a portion of the first enabling signal line is configured to form a gate of the fifth transistor;

wherein the orthographic projection of the first enabling signal line on the base substrate is on a side, away from the orthographic projection of the first conductive portion on the base substrate, of the orthographic projection of the second gate line on the base substrate;

wherein the third bridge portion and the second bridge portion share a portion of a conductive portion and use the shared portion of the conductive portion to connect to the third via-hole connection portion through a same via hole; and wherein an orthographic projection of the third bridge portion on the base substrate extends in a second direction, the second direction intersects the first direction, and the orthographic projection of the third bridge portion on the base substrate is between the orthographic projection of the first conductive portion on the base substrate and the orthographic projection of the first enabling signal line on the base substrate.

10. The display panel of claim 4, wherein the two or more transistors further comprise a second transistor; wherein a first electrode of the second transistor is connected to a gate of the driver transistor, and a second electrode of the second transistor is connected to the first electrode of the driver transistor, and a gate of the second transistor is connected to a first gate line; and a gate of the fifth transistor being connected to a first enabling signal line;

wherein the display panel further comprises a first conductive layer between the first active layer and the third conductive layer, the first conductive layer comprising:

the first enabling signal line, wherein an orthographic projection of the first enabling signal line on the base substrate extends in a first direction;

the first gate line, wherein an orthographic projection of the first gate line on the base substrate extends in the first direction;

a first conductive portion, wherein an orthographic projection of the first conductive portion on the base substrate covers an orthographic projection of the third sub-active portion on the base substrate, and the first conductive portion is configured to form the gate of the driver transistor; and a second enabling signal line, wherein an orthographic projection of the second enabling signal line on the base substrate extends in the first direction, and covers an orthographic projection of the sixth sub-active portion on the base substrate, and a portion of the second enabling signal line is configured to form a gate of the sixth transistor; and wherein the orthographic projection of the second enabling signal line on the base substrate is on a side, away from the orthographic projection of the first conductive portion on the base substrate, of the orthographic projection of the first enabling signal line on the base substrate; and an orthographic projection of the fourth bridge portion on the base substrate extends in a second direction, the second direction intersects the first direction, and the orthographic projection of the fourth bridge portion on the base substrate is between the orthographic projection of the first gate line on the base substrate and the orthographic projection of the second enabling signal line on the base substrate.

11. The display panel of claim 5, wherein a gate of the sixth transistor is connected to a second enabling signal line;

wherein the display panel further comprises a first conductive layer between the first active layer and the third conductive layer, the first conductive layer comprising:

the second enabling signal line, wherein an orthographic projection of the second enabling signal line on the base substrate extends in the first direction;

a first conductive portion, wherein an orthographic projection of the first conductive portion on the base substrate covers an orthographic projection of the third sub-active portion on the base substrate, and the first conductive portion is configured to form a gate of the driver transistor; and a second reset signal line, wherein an orthographic projection of the second reset signal line on the base substrate extends in the first direction, and covers an orthographic projection of the seventh sub-active portion on the base substrate, and a portion of the second reset signal line is configured to form a gate of the seventh transistor; and wherein the orthographic projection of the second reset signal line on the base substrate is on a side, away from the orthographic projection of the first conductive portion on the base substrate, of the orthographic projection of the second enabling signal line on the base substrate; and an orthographic projection of the fifth bridge portion on the base substrate extends in the first direction, and the orthographic projection of the fifth bridge portion on the base substrate is between the orthographic projection of the second reset line on the base substrate and the orthographic projection of the second enabling signal line on the base substrate.

12. The display panel of claim 1, wherein the single pixel driving circuit is configured to drive a light emitting unit to emit light, and the two or more transistors further comprise: a first transistor, and a seventh transistor; wherein a first electrode of the first transistor is connected to a first initial signal line, and a second electrode of the first transistor is connected to a gate of the driver transistor; and a first electrode of the seventh transistor is connected to a second initial signal line, and a second electrode of the seventh transistor is connected to a first electrode of the light emitting unit; and wherein the display panel further comprises:

a first conductive layer between the first active layer and the third conductive layer; and a second conductive layer between the first conductive layer and the third conductive layer, the second conductive layer comprising the first initial signal line and the second initial signal line, wherein an orthographic projection of the first initial signal line on the base substrate and an orthographic projection of the second initial signal line on the base substrate extend in a second direction.

13. The display panel of claim 12, wherein the single pixel driving circuit further comprises a capacitor; wherein a first electrode of the capacitor is connected to the power line, and a second electrode of the capacitor is connected to the gate of the driver transistor;

wherein the plurality of active portions further comprise:

a first active portion, at least part of the first active portion being configured to form a channel region of the first transistor; and a seventh active portion, at least part of the seventh active portion being configured to form a channel region of the seventh transistor; and wherein an orthographic projection of the power line on the base substrate extends in the second direction, and the orthographic projection of the power line on the base substrate is between an orthographic projection of the first active portion on the base substrate and an orthographic projection of the seventh active portion on the base substrate;

the orthographic projection of the first initial signal line on the base substrate is on a side, away from the orthographic projection of the power line on the base substrate, of the orthographic projection of the first active portion on the base substrate; and the orthographic projection of the second initial signal line on the base substrate is on a side, away from the orthographic projection of the power line on the base substrate, of the orthographic projection of the seventh active portion on the base substrate.

14. The display panel of claim 1, wherein the single pixel driving circuit is configured to drive a light emitting unit to emit light, and the two or more transistors further comprise: a first transistor, a second transistor, a fourth transistor, a sixth transistor, and a seventh transistor;

wherein a first electrode of the first transistor is connected to a first initial signal line, and a second electrode of the first transistor is connected to a gate of the driver transistor;

a first electrode of the second transistor is connected to the gate of the driver transistor, and a second electrode of the second transistor is connected to a first electrode of the driver transistor;

a first electrode of the fourth transistor is connected to a data line, and a second electrode of the fourth transistor is connected to the second electrode of the driver transistor;

a first electrode of the sixth transistor is connected to the first electrode of the driver transistor, and a second electrode of the sixth transistor is connected to a first electrode of the light emitting unit; and a first electrode of the seventh transistor is connected to a second initial signal line, and a second electrode of the seventh transistor is connected to the first electrode of the light emitting unit; and wherein the driver transistor, the first transistor, the second transistor, the fourth transistor, the fifth transistor, the sixth transistor, and the seventh transistor are P-type transistors.

15. The display panel of claim 1, wherein the two or more transistors further comprise: a first transistor, and a second transistor; wherein a first electrode of the first transistor is connected to a first initial signal line, and a second electrode of the first transistor is connected to a first electrode of the driver transistor; a first electrode of the second transistor is connected to a gate of the driver transistor, and a second electrode of the second transistor is connected to the first electrode of the driver transistor, the driver transistor and the first transistor being a P-type transistor, the second transistor being an N-type transistor;

wherein the third active portion further comprises an eighth via-hole connection portion connected to the third sub-active portion, the eighth via-hole connection portion is configured to form the via-hole connection portion, and the plurality of active portions further comprise:

a first active portion comprising a first sub-active portion and a first via-hole connection portion connected to each other, wherein the first sub-active portion is configured to form a channel region of the first transistor, and the first via-hole connection portion is configured to form the via-hole connection portion, wherein the display panel further comprises:

a second active layer between the first active layer and the third conductive layer, the second active layer comprising a second active portion, the second active portion comprising a second sub-active portion and a second via-hole connection portion connected to each other, the second sub-active portion being configured to form a channel region of the second transistor; and the at least one bridge portion further comprises:

a first bridge portion being connected to the first via-hole connection portion, the eighth via-hole connection portion, and the second via-hole connection portion through via holes, respectively.

16. The display panel of claim 15, further comprising:

a first conductive layer between the first active layer and the second active layer, the first conductive layer comprising:

a first reset signal line, wherein an orthographic projection of the first reset signal line on the base substrate extends in a first direction and covers an orthographic projection of the first sub-active portion on the base substrate, and a portion of the first reset signal line is configured to form a gate of the first transistor; and a first conductive portion, wherein an orthographic projection of the first conductive portion on the base substrate covers an orthographic projection of the third sub-active portion on the base substrate, and the first conductive portion is configured to form the gate of the driver transistor; and a fourth conductive layer between the second active layer and the third conductive layer, the fourth conductive layer comprising:

a first gate line, wherein an orthographic projection of the first gate line on the base substrate extends in the first direction, and is between the orthographic projection of the first reset signal line on the base substrate and the orthographic projection of the first conductive portion on the base substrate, the orthographic projection of the first gate line on the base substrate covers an orthographic projection of the second sub-active portion on the base substrate, a portion of the first gate line is configured to form a top gate of the second transistor;

wherein an orthographic projection of the first bridge portion on the base substrate extends in a second direction, the first direction intersects the second direction, the orthographic projection of the first bridge portion on the base substrate is on a side, facing the orthographic projection of the first conductive portion on the base substrate, of the orthographic projection of the first reset signal line on the base substrate, and the orthographic projection of the first bridge portion on the base substrate intersects the orthographic projection of the first gate line on the base substrate.

17. The display panel of claim 15, wherein a gate of the second transistor is connected to a first gate line, the single pixel driving circuit is configured to drive a light emitting unit to emit light, and the two or more transistors further comprise a sixth transistor; wherein a first electrode of the sixth transistor is connected to the first electrode of the driver transistor, and a second electrode of the sixth transistor is connected to a first electrode of the light emitting unit;

wherein the plurality of active portions further comprise:

a sixth active portion comprising a sixth sub-active portion and a sixth via-hole connection being connected to the sixth sub-active portion, the sixth sub-active portion being configured to form a channel region of the sixth transistor;

wherein the display panel further comprises: a first conductive layer between the first active layer and the second active layer, the first conductive layer comprising:

an enabling signal line, wherein an orthographic projection of the enabling signal line on the base substrate extends in the first direction and covers an orthographic projection of the sixth sub-active portion on the base substrate, and a portion of the enabling signal line is configured to form a gate of the sixth transistor; and the orthographic projection of the enabling signal line on the base substrate is on a side, away from an orthographic projection of the first gate line on the base substrate, of an orthographic projection of a first conductive portion on the base substrate; and wherein the at least one bridge portion further comprises:

a fourth bridge portion being connected to the eighth via-hole connection portion and the sixth connection portion through via holes, respectively, wherein the fourth bridge portion and the first bridge portion share a portion of a conductive portion, and use the shared portion of the conductive portion to connect to the eighth via-hole connection portion through a same via hole; and an orthographic projection of the fourth bridge portion on the base substrate extends in the second direction, and is between the orthographic projection of the enabling signal line on the base substrate and the orthographic projection of the first gate line on the base substrate, with the first direction and the second direction intersecting.

18. The display panel of claim 15, wherein the two or more transistors further comprise a fourth transistor; wherein a first electrode of the fourth transistor is connected to a data line, and a second electrode of the fourth transistor is connected to the second electrode of the driver transistor; and a gate of the fifth transistor is connected to an enabling signal line;

wherein the third active portion further comprises:

a fourth sub-active portion being connected to a side of the third sub-active portion away from the eighth via-hole connection portion, the fourth sub-active portion being configured to form a channel region of the fourth transistor; and a fourth via-hole connection portion connected between the fourth sub-active portion and the third sub-active portion, the fourth via-hole connection portion being configured to form the via-hole connection portion;

wherein the display panel further comprises: a first conductive layer between the first active layer and the second active layer, the first conductive layer comprising:

a second gate line, wherein an orthographic projection of the second gate line on the base substrate extends in the first direction and covers an orthographic projection of the fourth sub-active portion on the base substrate, and a portion of the second gate line is configured to form a gate of the fourth transistor;

wherein the orthographic projection of the second gate line on the base substrate is between an orthographic projection of a first conductive portion on the base substrate and an orthographic projection of the enabling signal line on the base substrate;

wherein the at least one bridge portion further comprises:

a second bridge portion being connected to the fourth via-hole connection portion and the fifth connection portion through via holes, respectively; and wherein an orthographic projection of the second bridge portion on the base substrate is between the orthographic projection of the enabling signal line on the base substrate and the orthographic projection of the first conductive portion on the base substrate.

* * * * *